United States Patent
Winston et al.

(10) Patent No.: US 6,541,694 B2
(45) Date of Patent: Apr. 1, 2003

(54) NONIMAGING LIGHT CONCENTRATOR WITH UNIFORM IRRADIANCE

(75) Inventors: Roland Winston, Chicago, IL (US); Randy C. Gee, Arvada, CO (US)

(73) Assignees: Solar Enterprises International, LLC, Chicago, IL (US); Duke Solar Energy, LLC, Raleigh, NC (US)

( * ) Notice: Subject to any disclaimer, the term of this patent is extended or adjusted under 35 U.S.C. 154(b) by 0 days.

(21) Appl. No.: 09/810,696

(22) Filed: Mar. 16, 2001

(65) Prior Publication Data

US 2003/0034063 A1 Feb. 20, 2003

(51) Int. Cl.[7] .................................. H01L 31/052
(52) U.S. Cl. ................. 136/246; 136/259; 126/685; 126/690; 126/694; 126/684; 359/853; 359/857; 359/861; 359/894
(58) Field of Search ................. 136/246, 259; 126/685, 690, 694, 684; 359/853, 857, 861, 894

(56) References Cited

U.S. PATENT DOCUMENTS

| 3,713,727 | A | * | 1/1973 | Markosian et al. ......... 359/853 |
| 4,234,352 | A | * | 11/1980 | Swanson .................... 136/253 |
| 4,964,713 | A | * | 10/1990 | Goetzberger ................ 359/867 |
| 5,089,055 | A | * | 2/1992 | Nakamura .................... 136/248 |
| 5,716,442 | A | * | 2/1998 | Fertig ........................ 136/246 |
| 6,057,505 | A | * | 5/2000 | Ortabasi ..................... 136/246 |
| 6,225,551 | B1 | * | 5/2001 | Lewandowski et al. ..... 136/246 |
| 6,333,458 | B1 | * | 12/2001 | Forrest et al. .............. 136/259 |

* cited by examiner

Primary Examiner—Alan Diamond
(74) Attorney, Agent, or Firm—Michael D. Rechtin; Foley & Lardner

(57) ABSTRACT

A nonimaging light concentrator system including a primary collector of light, an optical mixer disposed near the focal zone for collecting light from the primary collector, the optical mixer having a transparent entrance aperture, an internally reflective housing for substantially total internal reflection of light, a transparent exit aperture and an array of photovoltaic cells disposed near the transparent exit aperture.

21 Claims, 21 Drawing Sheets

At L = D

At L = 1.4D

At L = 2D

At L = 2.5D

At L = 3D

US 6,541,694 B2

NONIMAGING LIGHT CONCENTRATOR WITH UNIFORM IRRADIANCE

Certain rights in this invention are retained by the U.S. Government pursuant to Contract No. ADC-0-30444-01 of the National Renewable Energy Laboratory of the U.S. Department of Energy.

BACKGROUND OF THE INVENTION

The present invention is related to a system and method for solar electric power generation. In particular, the invention is related to a nonimaging optical mixer for producing a substantially uniform irradiance on a concentrating photovoltaic (CPV) array.

Concentrating photovoltaic (CPV) converters are a promising option for solar electric power generation. Photovoltaic cells placed in highly concentrated sunlight can produce electric power very efficiently, eliminating the need for heat engines operating at high temperatures. However, sunlight concentrated by a typical parabolic dish produces highly non-uniform flux in the focal zone. Photovoltaic cells placed in a rectangular array near the focus are subject to this highly non-uniform irradiance, a condition that degrades the electrical output of the cell array. Typical CPV array electrical interconnection schemes result in performance output that is severely limited by the cell with the lowest irradiance. To increase power output, the irradiance across the CPV array must be much more uniform then heretofore achievable.

It is therefore an object of the invention to provide an improved method, system and apparatus for solar electric power generation.

It is another object of the invention to provide a novel method, system and apparatus for solar electric power generation from a concentrating photovoltaic (CPV) array.

It is a further object of the invention to provide an improved method, system and apparatus utilizing an optical mixer to generate a substantially uniform illumination output for enhanced CPV efficiency.

It is an additional object of the invention to provide an improved method, system and apparatus utilizing a highly efficient, inexpensive optical mixer to output a substantially uniform light pattern onto a photoelectric or photovoltaic cell array.

It is yet another object of the invention to provide an improved method, system and apparatus using broken symmetry optical mixers and/or an exit aperture concentrator to provide highly concentrated, substantially uniform output light flux for illumination of a photoelectric cell array.

Other objects, advantages and alternative forms of the invention will become apparent from consideration of the detailed description and drawings described hereinafter.

SUMMARY OF THE INVENTION

There are two principal pathways to efficient photovoltaic conversion of solar energy to electricity, namely, low cost cells operated at ambient solar flux and higher cost cells operated with concentrated solar flux. The latter application imposes a requirement on the concentrator that is specific to photovoltaic applications, namely, the irradiance on the cell needs to be quite uniform. This is because non-uniform irradiance on the cell degrades the electrical performance thereby reducing conversion efficiency.

The invention is therefore generally directed to nonimaging optical mixer designs that produce uniform flux for use with photovoltaic dish concentrators. In one example design a reflector tube, such as one having a square cross-section, is placed near the focal zone and preferably just above the focal point of a primary dish concentrator so that entering rays of light are reflected and "mixed" until the light exits at the other end of the reflector tube. The focal zone of a concentrator is the area where the light is substantially most concentrated, sometimes referred to as the "circle of least confusion", or the "beam waist". A CPV cell array is placed near the exit of the reflector tube where the "mixed" light is highly uniform. A second example design uses refractive optics wherein a solid body, such as a fused silica tube, is placed just above or near the focal point of the dish concentrator. The square aperture of the silica tube face closest to the primary is the target plane for the primary dish. Rays of sunlight are refracted as they pass into the silica tube, and only a small amount of energy is reflected and lost. Nearly all the rest of the light that enters the silica tube will reach the exit aperture of the tube with virtually no optical loss. This advantageous result occurs because as light rays pass through the silica tube and encounter the walls of the tube, the rays are entirely reflected due to substantially total internal reflection (TIR). Therefore, at the exit aperture of the silica tube, the light has been well mixed and highly uniform irradiance is achieved. In a third example design the solid body of the optical mixer can be a liquid with containment walls of appropriate index of infraction to perform the TIR functionality. In a fourth example design even higher concentration ratios are achieved, up to about 2000 times, by performing further light concentration within an optical mixer system. In one form of this example, the optical mixer has a truncated, pyramided shape and in another form the optical mixer includes at least one of a CPC (compound parabolic concentrator) disposed at the exit aperture of the selected optical mixer before the CPV cell array. Here we use the term CPC in the generalized sense that has been adopted in the art of nonimaging optics. It includes designing for specific attributes such as the well known concepts of total internal reflection and tailoring for specific angular properties. For example, see Welford and Winston, *High Collection Nonimaging Optics*, Academic Press, 1989 and U.S. Pat. Nos. 5,586,013 and 5,971,551.

DETAILED DESCRIPTION OF PREFERRED EMBODIMENTS

Figure 1:
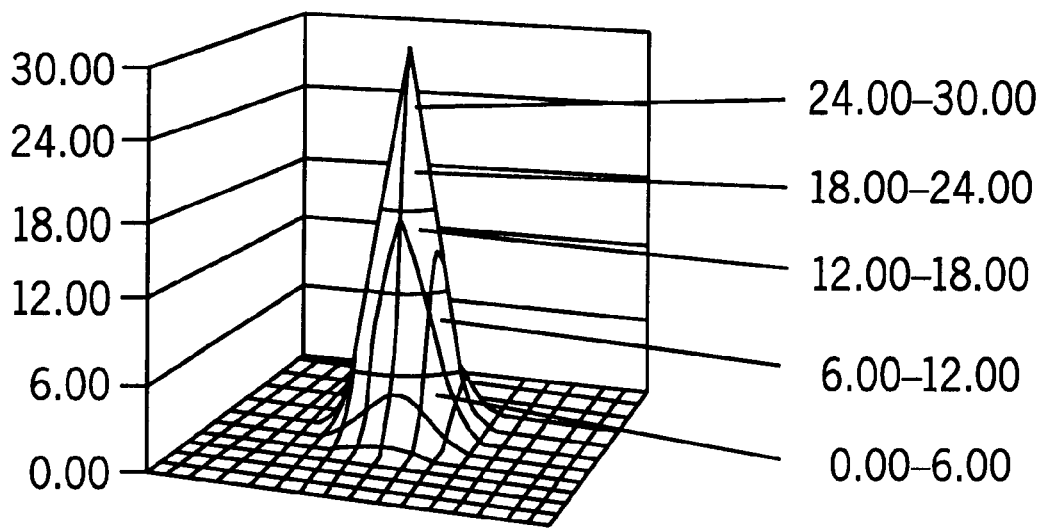
FIG. 1 illustrates a light flux contour map at the entrance to an optical mixer.
Figure 2:
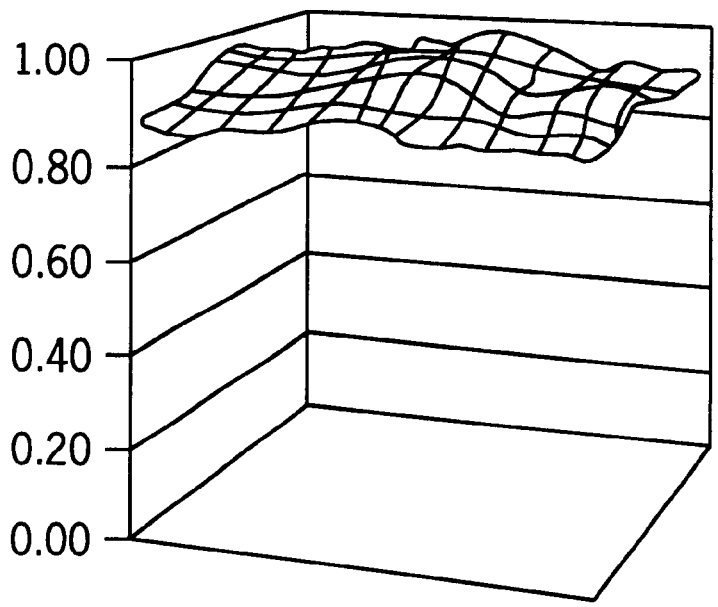
FIG. 2 illustrates a light flux contour map at the exit aperture of a refractive optical mixer.
Figure 3:
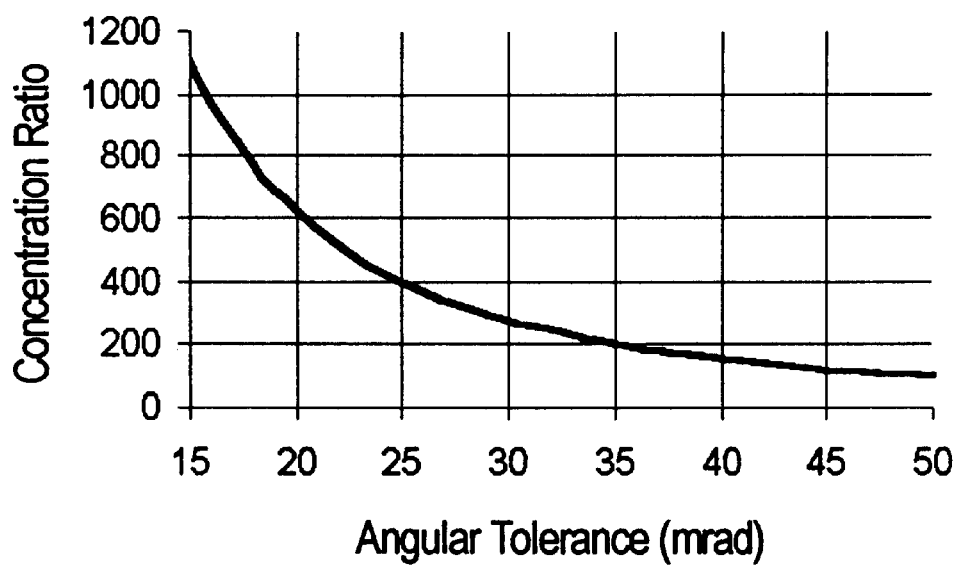
FIG. 3 illustrates maximum concentration versus angular tolerance for a parabolic primary dish reflector.
Figure 4:
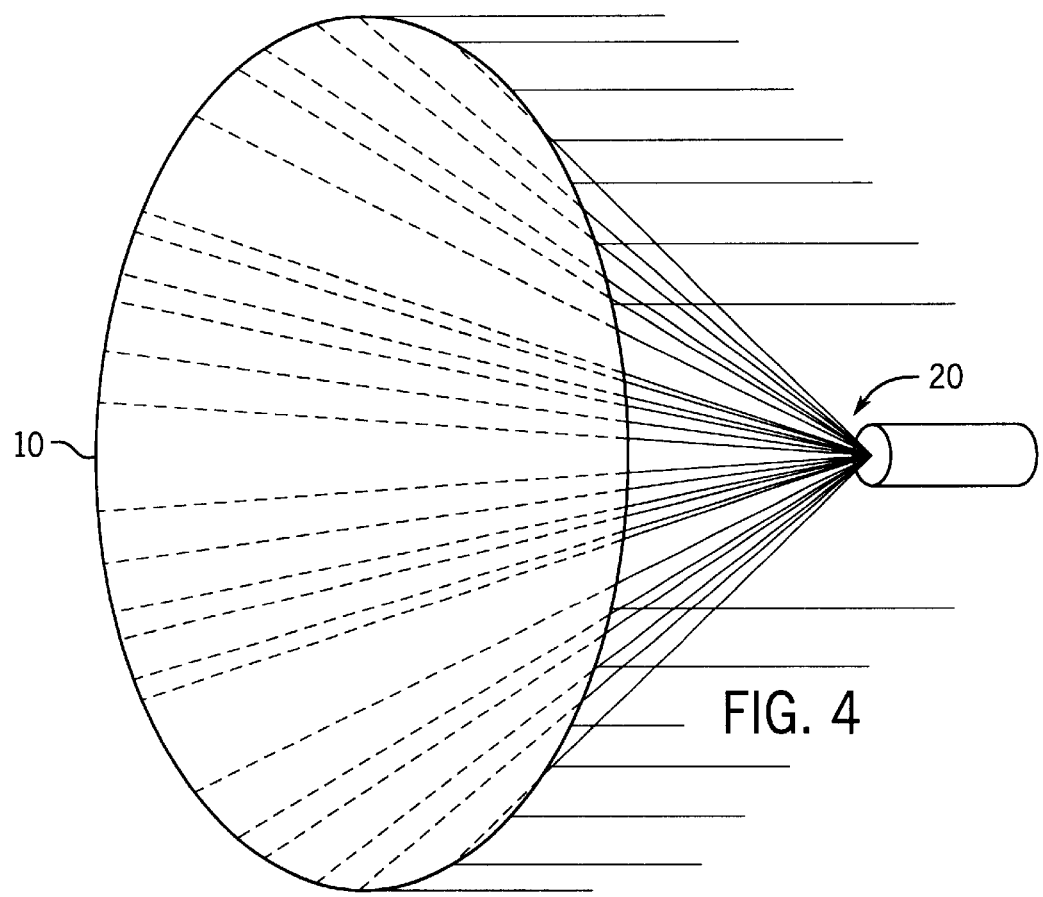
FIG. 4 illustrates a parabolic primary reflector dish and optical mixer.

In order to achieve the desired high efficiency solar electric power generation, a highly concentrated solar flux is provided by a conventional primary reflector dish 10 (see, for example, FIG. 4). It is to be noted that a primary collector and concentrator for light can take on many forms besides a reflector dish, such as a plurality of reflectors, heliostats, a tailored reflector shape, refractive lens (conventional and tailored) systems and any conventional optical device which can collect and focus light and input that light to an optical mixer. A highly non-uniform light flux is produced from the primary concentrator as shown in FIG. 1, and the objective is to achieve a substantially uniform output flux irradiance on a CPV solar cell target (see one example of an output flux in FIG. 2 which will be described in more detail hereinafter).

In the most preferred form of the invention, the objective is to achieve irradiance uniformity on the CPV target (the solar cell) of better than +/–5% with an intercept factor exceeding 0.9. The desired flux concentration is in the 100 to 500 times ambient solar irradiance range. Wide angular acceptance is desirable to accommodate tracking error, fabrication tolerance and the solar subtense angle. In a most preferred form, the invention uses a primary reflecting dish concentrator with a secondary nonimaging concentrator disposed near a focal zone or point 20. A "typical" dish concentrator has been selected for analysis with characteristics defined by f/D=0.6, concentration range of 100 to 500 times, slope errors of 3 mrad rms, and 1 mrad rms specularity error. As shown in FIG. 4, a primary reflector dish with 45-degree rim angle φ (f/d approximately=0.6) attains the desired range of concentration ratios (100 to 500 times) with fairly generous angular tolerance in the 20 to 50-mrad range. Notice that the relation between concentration and rim angle does not depend on the detailed shape of the primary reflector. Therefore:

$C=1/(4\theta^2)$ (small angle approximation where θ is substantially the maximum angle of light incidence with the longitudinal axis of the dish 10 (and the optical mixer to be described hereinafter). Since the angular characteristics of the primary suffice to satisfy the tolerance requirement, we can utilize a secondary optical device to attain the desired flux uniformity. Namely, an optical mixer can produce the desired substantially uniform solar flux on the CPV cell.

Several examples of preferred optical mixer designs have been considered using conventional ray trace methods. The first example design is a cylindrical refractive optical mixer; the second example design is a square-shaped cross-section refractive optical mixer; the third example design is a square-shaped cross-section reflective optical mixer and the fourth example design is a square-shaped cross-section container holding a liquid and the container walls have an index of refraction enabling total internal reflection.

Figure 5:
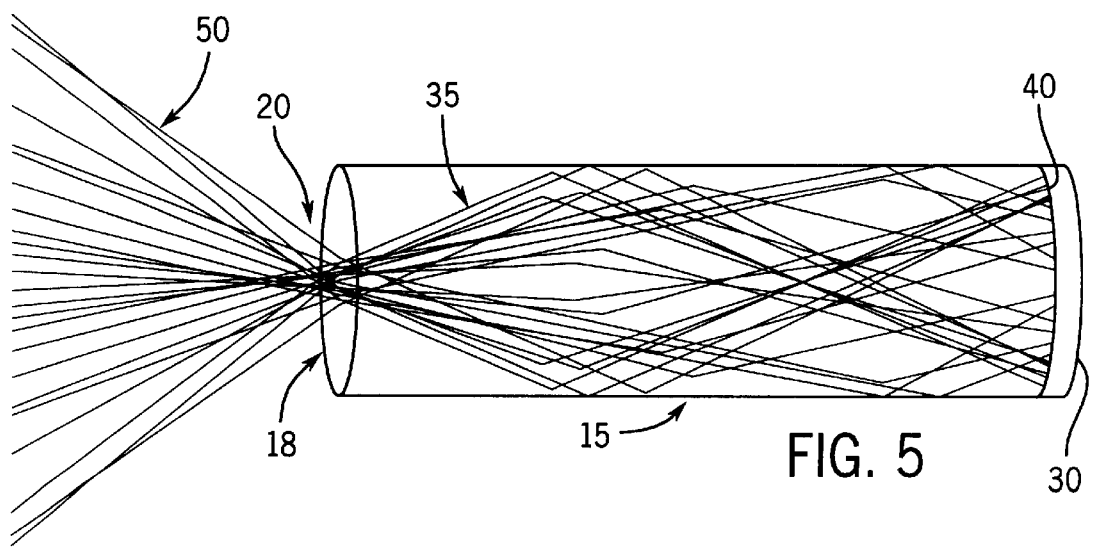
FIG. 5 illustrates sample light ray trajectories in a cylindrical refractive optical mixer.
Figure 6A:
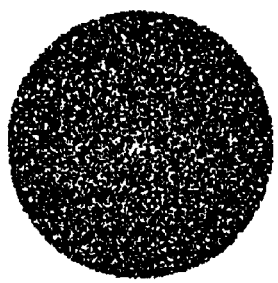
FIG. 6 illustrates light flux distributions for a variety of cylinder length to diameter (L/D) ratios.
Figure 6B:
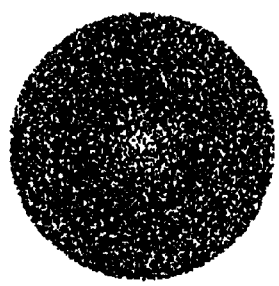
Figure 6C:
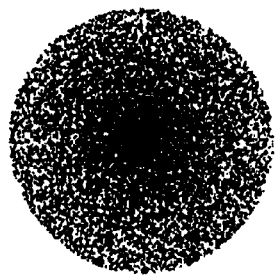
Figure 6D:
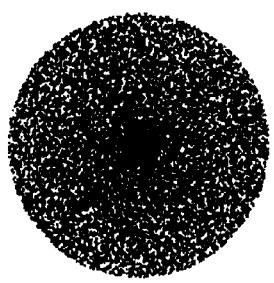
Figure 6E:
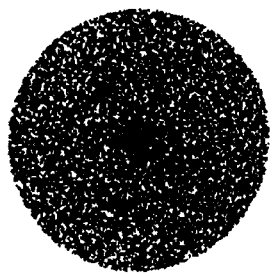

The first example optical mixer design investigated was a solid cylindrical tube 15 of fused silica, placed substantially at the focal point 20 of the primary reflector dish 10 (see FIGS. 4 and 5). The circular entrance aperture 18 of the cylinder cross section closest to the vertex is the target plane for the primary reflector dish 10. Photovoltaic CPV cells 30 (shown in phantom in FIG. 5) are located at the circular shaped exit aperture 40 on the far end of the cylindrical tube 15. Rays from the primary are refracted as they pass through the circular aperture of the cylindrical tube 15 of silica. Through substantially total internal reflection (hereinafter, TIR), rays 35 are reflected off the sides of the cylindrical tube 15 of silica until the rays 35 reach the exit aperture 40 (and the CPV cells 30). The cylindrical shape of the optical mixer is a natural choice given that the aperture of the primary reflector dish 10 is also circular. However, the array of the CPV cells 30 are most preferably rectangular (or square), so in this sense the cell array geometry does not match well with the cylindrical tube 15. One approach was to evaluate the cylindrical refractive optical mixer (the tube 15), and also consider a similar design in which the entrance aperture is circular, but the exit aperture 40 is square.

The conventional, off-the-shelf ray-trace code ASAP (a trademark of Breault Research Organization, Tucson, AZ) was used to evaluate the cylindrical refractive mixer design. A concentration ratio of 200×(times) was analyzed, consistent with the 100 to 500 times range of interest. The refractive index of the silica tube 15 was taken as 1.45, and the pillbox sunshape with a half-angle width of 0.267 degrees was used. For the purpose of simplicity, the reflectance of the primary was assumed to be 100%, although specularity and slope errors were included in the model. Tracking error was assumed to be zero, but an analysis of the impact of tracking error is included hereinafter. Reflectance losses off the front surface of the silica tube (about 3.7%) were calculated within ASAP based on Fresnel losses. The model also accounted for refraction and TIR. Absorption of light by the silica tube was ignored, since this loss is expected to be negligible. In one example, the ray trace analysis was performed for a fixed wavelength of 600 nm, and in general, 600,000 rays were traced for each run.

A geometric and optical model of the optical mixer design was constructed to evaluate the level of flux uniformity that could be achieved. Shown in FIG. 4 is the modeled geometry. The CPV cells 30 were not modeled. Rather, to evaluate flux uniformity, we examined only the circular exit aperture 40 of the cylindrical tube 15 of silica, and a 15×15 bin array was used to accumulate ray trace "hits". In the example, a circular shield (not shown) was included in the model to ensure that rays 35 blocked by the array of the CPV cells 30 were accounted for in the analysis. The shadow cast by the cells 30 on the primary dish 10 creates a small "dead spot" that makes flux uniformity more difficult to achieve. FIGS. 4 and 5 show only a few of the rays 35 from a normal ray trace to provide a clear understanding to the reader.

FIG. 5 shows example traced light rays 35 as they are refracted through the air/silica interface, and reflected to the back plane exit aperture 40 of the cylindrical tube 15. In all cases, the rays 35 that enter the cylindrical tube 15 either pass to the aperture 40 directly or are reflected via TIR to the aperture 40. That is, all the light rays 35 satisfy the incidence angle requirements for TIR.

Note that incoming rays of light 50 fall easily within the entrance aperture 18 of the cylindrical tube 15. The 200× concentration ratio is easy to achieve for the baseline geometry with a primary mirror rms slope error of 3 mrad. Note also that the entrance aperture 18 of the cylindrical tube 15 is slightly displaced from the focal point 20. As shown later in the next subsection for a square refractive optical mixer, displacement away from the focal point 20 modifies the optical pattern, but does not alter the overall effectiveness of the optical mixer provided the mixer length is optimized.

Various lengths of the cylindrical tube 15 of FIG. 5 were examined with ray tracing to determine where flux uniformity is maximized. The cylindrical tube 15 of FIG. 5 has an L/D of 3. Inspection of FIG. 5 shows that some lengths can be expected to produce more uniform flux than certain other lengths. For example, L/D's of around 1 and 3 appear better than an L/D of about 2. "Spots diagrams" at several different lengths are shown in FIG. 6 which show the pattern of this particular optical mixer design. Each "spot" represents a single traced light ray. While the light distribution is substantially improved, these distributions have too much flux in the center or, there is not enough flux in the center. This is the result of a centered bundle of rays at the entrance aperture 18, reflecting inside the uniform cylindrical tube 15 in a nearly periodic manner. The most uniform fluxes are achieved with cylindrical tube 15 L/D's of 1.4 and 3.

However, the lowest standard deviation of the flux, relative to the mean flux, over the array is about 20%. The minimum flux in the 15×15 bin array is 33% less than the average flux in the array. Both measures are fairly high relative to a most preferred +/−5% in flux uniformity.

Figure 7:
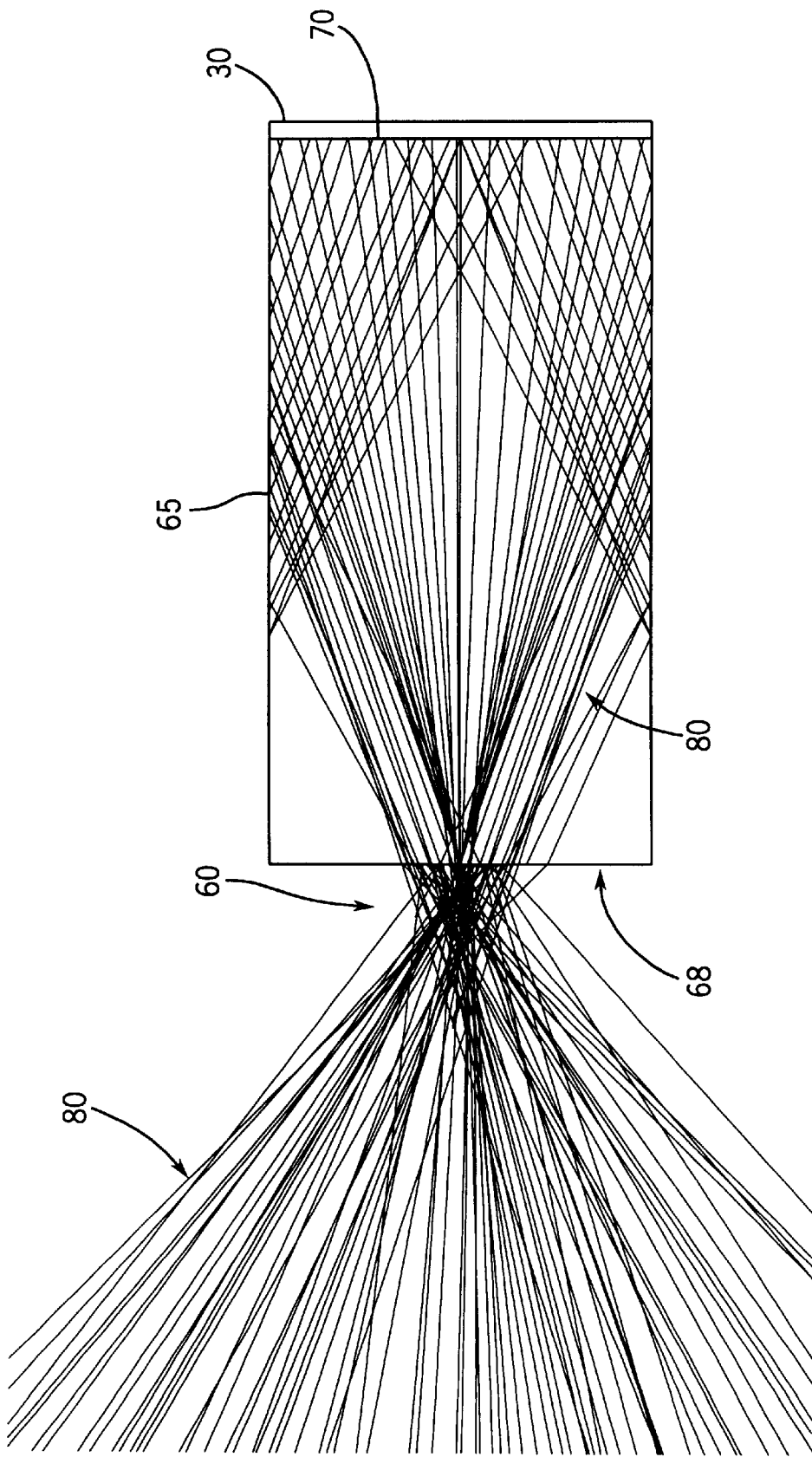
FIG. 7 illustrates example light ray trajectories in a square cross section refractive optical mixer.

The second optical mixer design that was examined is similar to the first; however, instead of the cylindrical tube 15 of fused silica, a solid square-shaped cross-section tube 65 of fused silica is used (see FIG. 7). As with the prior cylindrical design, the square-shaped silica tube 65 is placed just above focal point 60 of the dish concentrator. A square entrance aperture 68 of the silica face closest to the primary reflector dish 10 is the target plane for the dish 10. Rays of light 80 are refracted as they pass into the silica tube 65, and only about 3.7% of the energy is reflected and lost. Nearly all the rest of the light 80 that enters the silica tube 65 will reach a square exit aperture 70 of the tube 65 and with virtually no optical loss. The refractive square-shaped tube 65 as an optical mixer was analyzed through ray tracing and the same model assumptions were used as described above. However, the square-shaped tube 65 of silica led to the square exit aperture 70 which is better suited for the array of the CPV cells 30.

Figure 8:
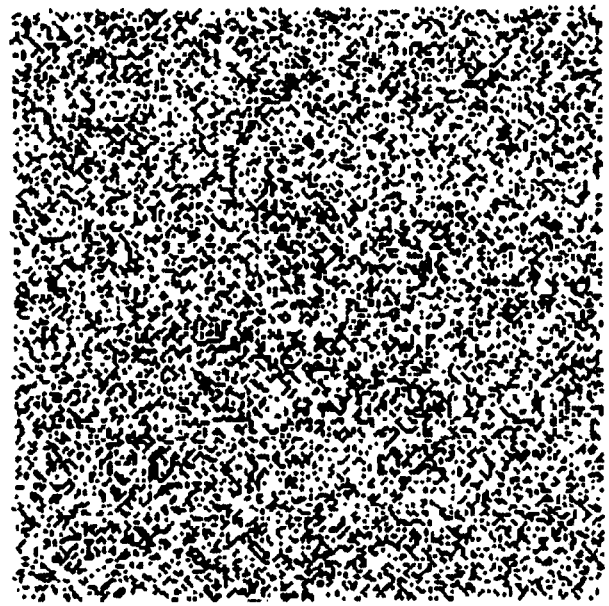
FIG. 8 illustrates a cross section of light flux output from the optical mixer of FIG. 7.

A close-up view of the square refractive optical mixer is illustrated in FIG. 7, along with the traced rays 80 as they are refracted through the air/silica interface, and reflected to the back plane of the tube 65. All the rays 80 that enter the tube 65 either pass to the back plane (the exit aperture 70) directly or are reflected via TIR to the back plane (i.e., the exit aperture 70). The length of the square silica tube 65 shown above is 1.9 times its width. This length was depicted because it results in a very uniform flux distribution along the square CPV cells 30 arrayed at the back of the tube 65. To illustrate this uniformity FIG. 8 shows a "spots diagram" at the square exit aperture 70. Note the excellent uniformity of the "spots".

Figure 9A:
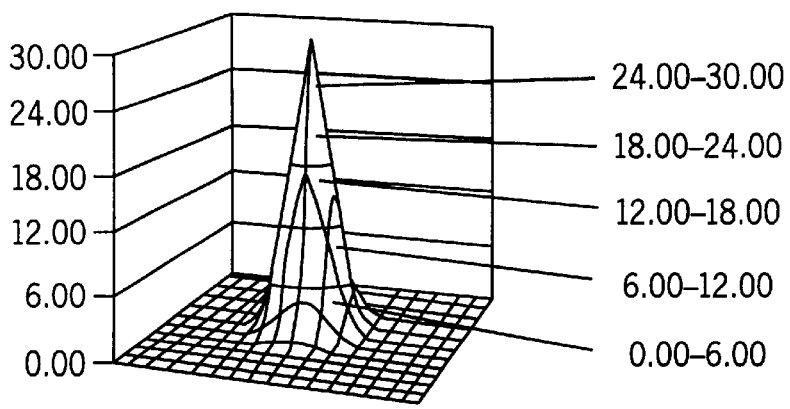
FIG. 9A illustrates a light flux contour map at the entrance to the optical mixer of FIG. 7.
Figure 9B:
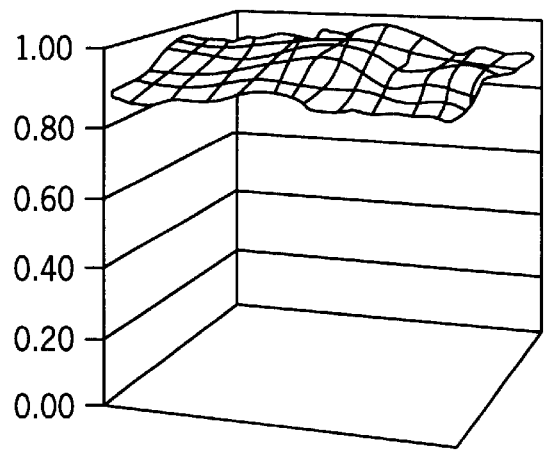
FIG. 9B illustrates a light flux contour map at the exit aperture of the mixer of FIG. 7.

To further illustrate the high level of flux uniformity that this design achieves, two three-dimensional flux profiles are shown in FIGS. 9A and 9B below. FIG. 9A shows the highly non-uniform flux entering the optical mixer (the tube 65). FIG. 9B shows the flux at the exit aperture 70 of the refractive optical mixer (the tube 69), where the CPV cells 30 are located. Note that the scale on FIG. 9A is 30 times larger than in FIG. 9B. The flux at the exit aperture 70 is highly uniform and the minimum flux irradiance is within 6% of the average flux across the entire cell array. The standard deviation of the flux, relative to the mean flux, over the cell 30 is less than 4%. Clearly, the square shape of the refractive square-shaped tube 65 adds irregularity to the pattern of reflected light rays to, and this results in much better "mixing" and a high level of desired light flux uniformity.

A third example of an optical mixer design is a square-shaped reflector tube 85 (see FIG. 10) positioned near the focal point 60 of the primary reflector dish 10 (not shown) so that entering rays of light 88 are reflected and "mixed" until the light 88 exits or terminates at exit aperture 86 of the reflector tube 85 onto the array of the cells 30 (in phantom). The array of the CPV cells 30 is placed adjacent the aperture 86 end of the reflector tube 85 where the "mixed" light is highly uniform. With this design, the primary optical loss is the reflection loss each time a ray of the light 88 strikes the square reflector tube 85. We have used a reflectance of 95% for the square reflector tube 85, and the same model assumptions were used as previously described.

Figure 11:
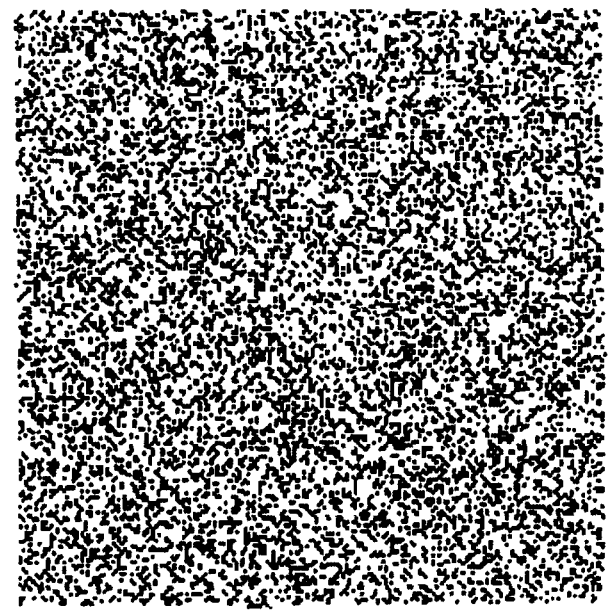
FIG. 11 illustrates a cross section of light flux output from the optical mixer of FIG. 10.

The length of the square reflector tube 85 shown is 1.52 times the width, a length selected because it results in a very uniform flux distribution along the square CPV cells 30 at the back of the reflector tube 85, and yet is quite short in overall length. Overall length of the reflector tube 85 should be minimized, since longer lengths can result in increased reflection losses. To illustrate this uniformity we show in FIG. 11 a "spots diagram" of light flux at the exit aperture 86 of the square-shaped refractive optical mixer (the reflector tube 85). As with the square refractive mixer, excellent uniformity is apparent.

Figure 12A:
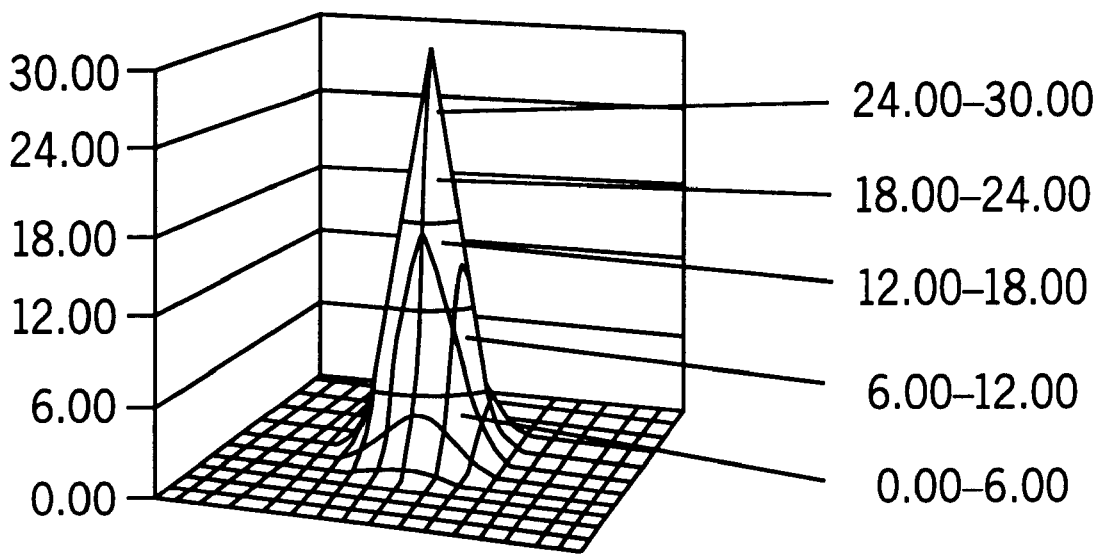
FIG. 12A illustrates a light flux contour map at the entrance to the reflective optical mixer of FIG. 10.
Figure 12B:
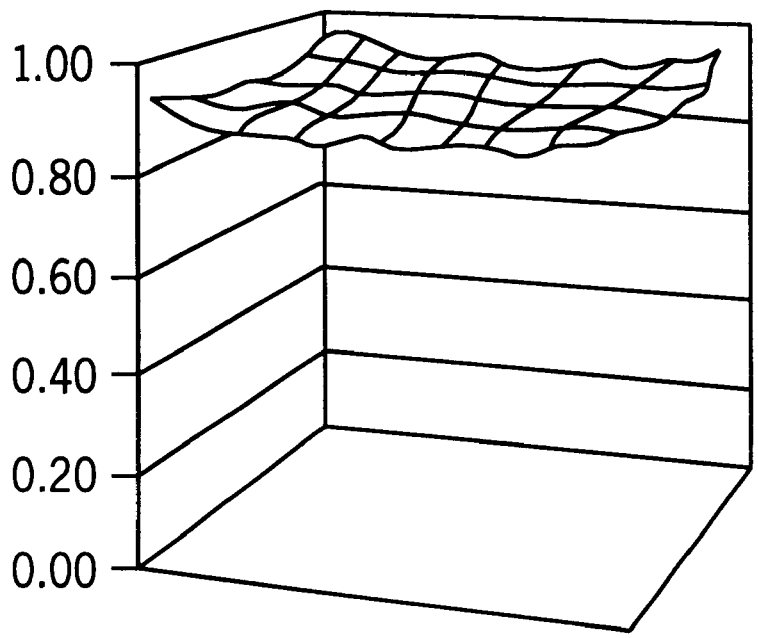
FIG. 12B illustrates a light flux contour map at the exit of the reflective optical mixer of FIG. 10.

Three-dimensional flux profiles are shown in FIGS. 12A and 12B for the reflector tube 85. The first profile of FIG. 12A shows the highly non-uniform flux of the light 88 entering the tube 85. This is the same entrance profile shown previously in FIG. 1 for the refractive mixer (the cylindrical tube 15). The second profile of FIG. 12B shows the flux of the light 88 at the exit aperture 86 of the reflector tube 85, where the array of the CPV cells 30 is located. The flux of the light 88 at the exit aperture 86 is highly uniform, and the minimum flux irradiance is within 6% of the average flux across the entire array of the CPV cells 30. The standard deviation of the flux, relative to the mean flux, over the array is less than 3%. This level of flux uniformity is excellent, and is slightly better than that of the square-shaped refractive mixer tube 65.

In another embodiment of the invention, the optical mixer comprises at least in part a transarent liquid 100 disposed in a transparent container 90 (see FIG. 20) with the liquid 100 having a refractive index=n in order to maintain total internal reflection.

The n should be $\geq \sqrt{(1+\sin^2\phi)}$. For $\phi=45°$ (an optimal value for a reflective dish primary is in the neighborhood of 45°) and n should be $>\sqrt{(1.5)}=1.22$, which encompasses most practical liquids, such as water (n=1.33). The container has to have transparent walls on all six sides and high transparency glass and acrylic are examples (although many other conventional materials can be used).

Figure 20:
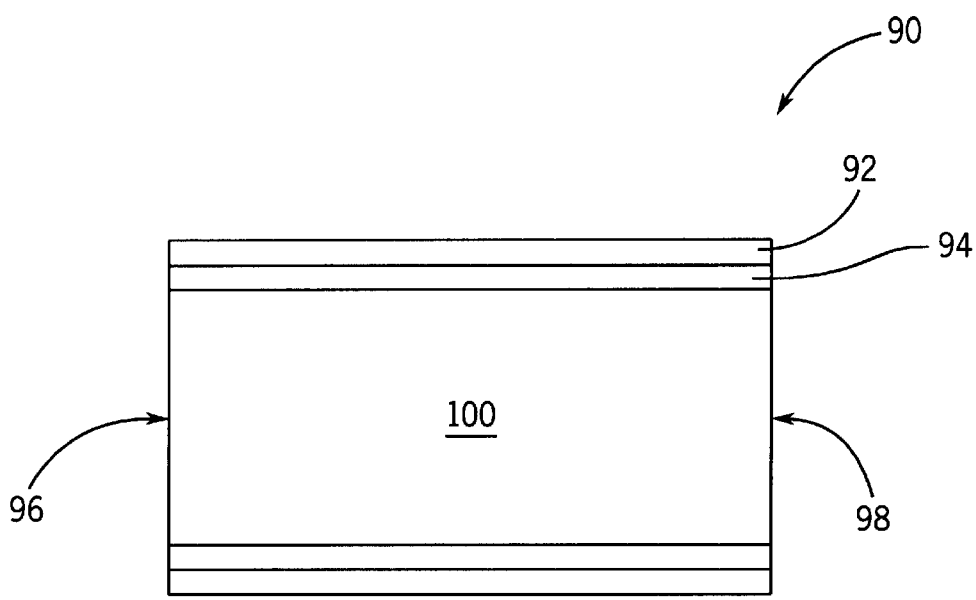
FIG. 20 illustrates a liquid filled optical mixer.

In yet a further embodiment of the invention the optical mixer can take the form of container 90 but having opaque walls 92, such as a metal, and also having an inner liner of a material 94 of low refractive index $n_2$, such as, for example, Teflon (polytetrafluoroethylene)(see FIG. 20). An entrance aperture 96 and an exit aperture 98 can be any transparent material, such as a glass or acrylic. The container 90 holds a transpaent liquid 100 of index $n_1$, (such as water with $n_1 \cong 1.333$). The condition on the various indices $n_1$ and $n_2$ in order to enable TIR of light input to the optical mixer (the container 90) is $(n_1^2-n_2^2)^{1/2} > \sin\phi$, where $\phi$ is the angular acceptance of the mixer, in this case the rim angle of the primary reflector dish 10. For example:

| $n_1$ | $n_2$ | $\phi$ |
|---|---|---|
| 1.5 | 1.32 | 45° |
| 1.47 | 1.29 | 45° |
| 1.47 | 1.32 | 40° |

This table shows that Teflon walls 94 would maintain TIR with many conventional, practical liquids.

Figure 10:
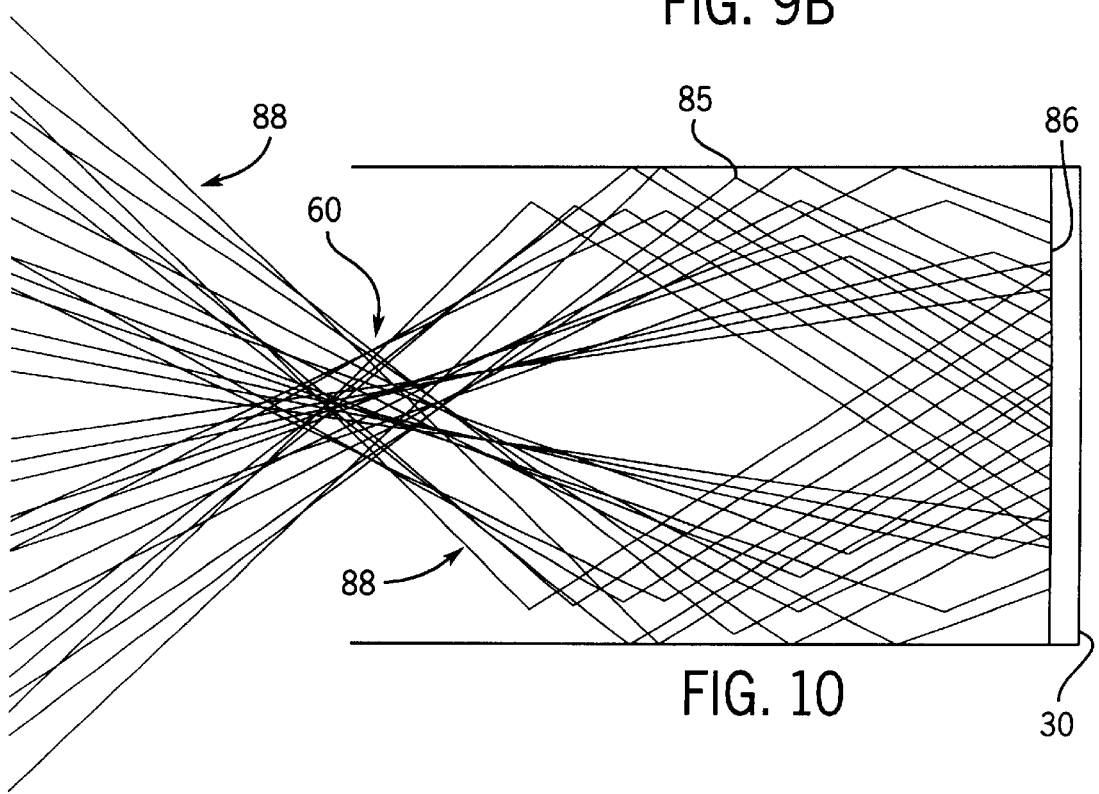
FIG. 10 illustrates a square cross section reflective optical mixer and examples of light ray trajectories.
Figure 13A:
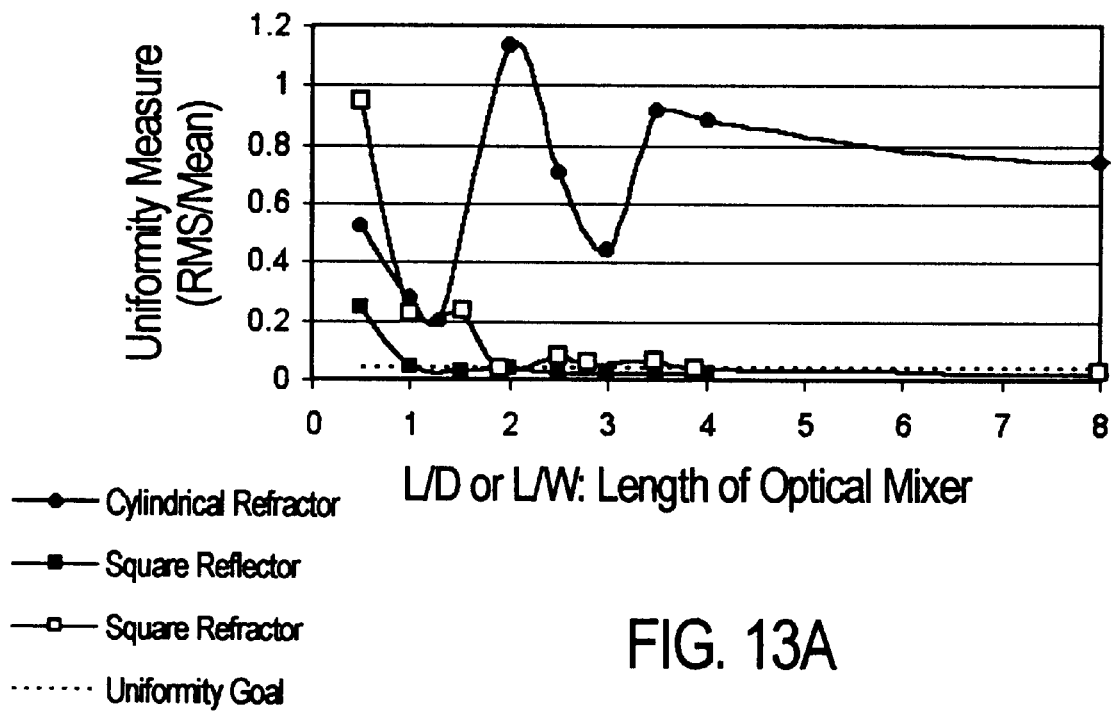
FIG. 13A illustrates a comparison of three optical mixer designs for standard deviation of flux relative to an average flux and FIG. 13B is for the minimum flux relative to the average flux.
Figure 13B:
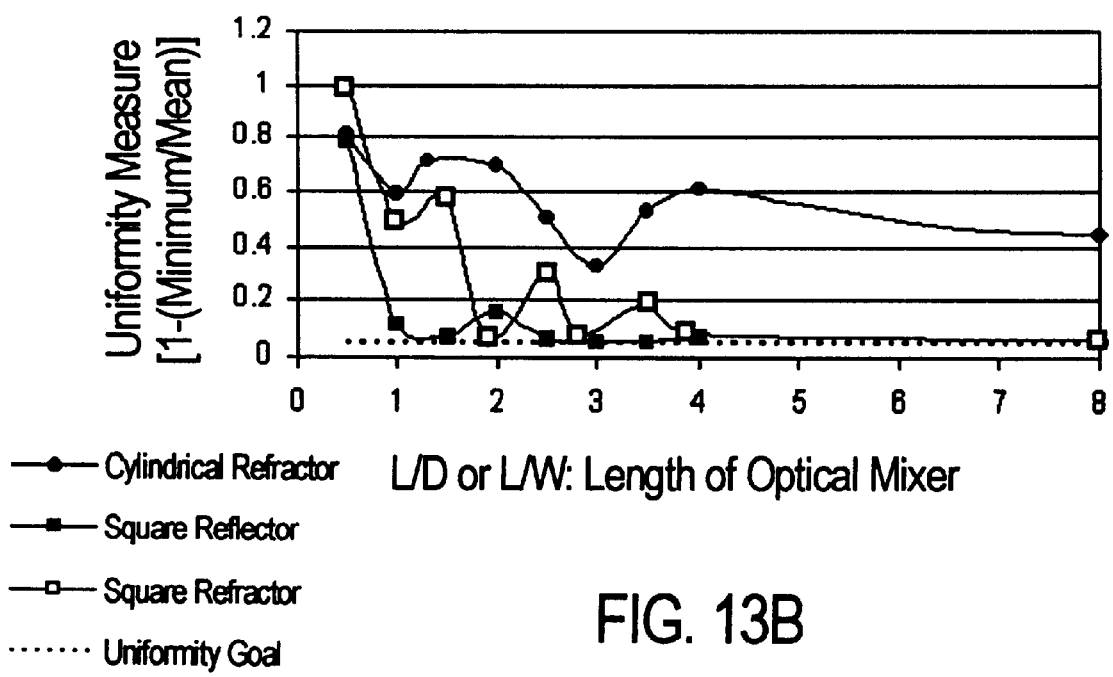

A comparison of the first three optical mixer designs of FIGS. 5, 7 and 10 are provided in FIGS. 13A and 13B. Two measures of flux uniformity are shown, and the measure of flux uniformity used in FIG. 13A is the standard deviation of the flux, relative to the mean value of the flux. This measure of uniformity is influenced by the flux distribution over the entire array of the CPV cells 30. Both of these square-shaped optical mixers are shown to satisfy the most preferred 5% uniformity goal for certain select optical mixer lengths. The cylindrical refractive mixer (the cylindrical tube 10) of FIG. 5 does not perform as well as the others. FIG. 13B shows uniformity as measured by the relationship of the minimum flux (in a 15×15 bin) to the average flux over the array of the CPV cells 30. Again, the cylindrical refractor tube 15 falls short of the most preferred goal.

Figure 14:
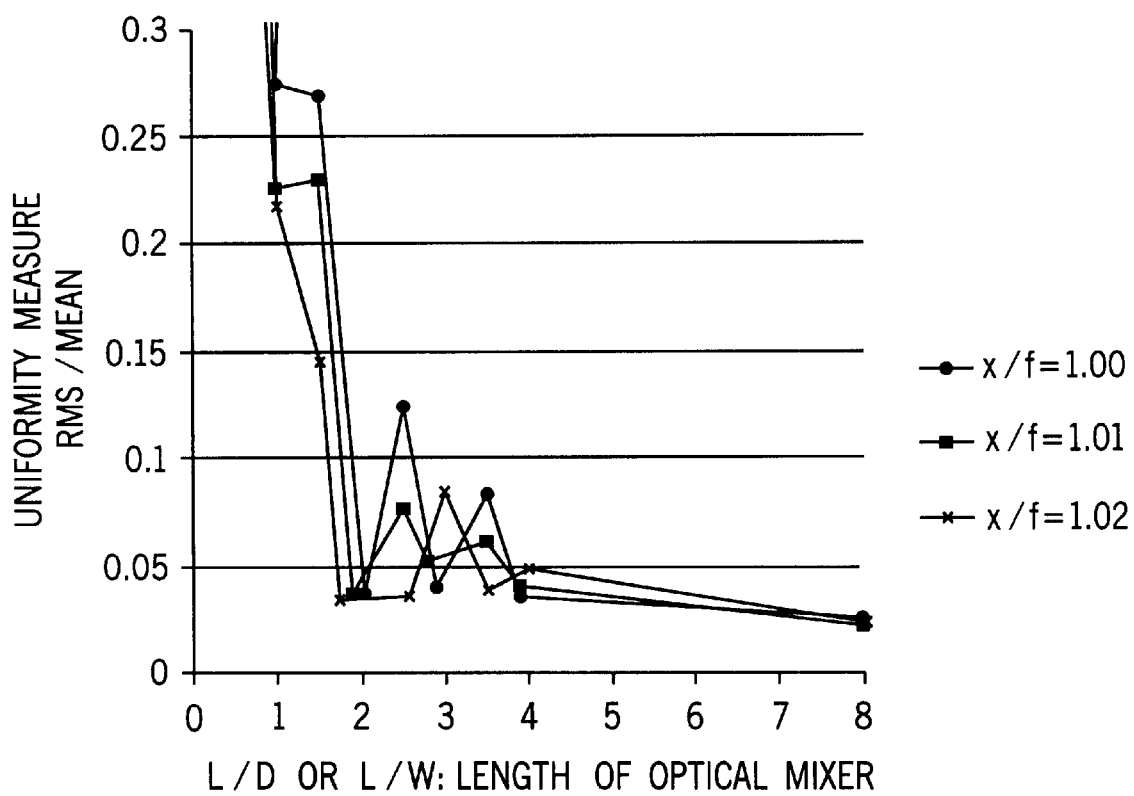
FIG. 14 illustrates the effect of optical mixer placement relative to the focal point by uniformity measure versus length of the optical mixer.

In FIGS. 5, 7 AND 10, the x/f value is 1.01. The "x" is the distance from the entrance aperture of the optical mixer to the vertex of the primary reflector dish 10. The "f" is the focal length of the reflector dish 10. Thus x/f is meant to denote where the entrance aperture of the particular optical mixer is located relative to the focal point of the reflector dish 10. An x/f of 1.01 means the mixer aperture is 1% further from the reflector dish vertex than the actual focal point. Increasing the distance between the focal point and the optical mixer allows the incoming flux to spread somewhat before it enters the mixer aperture. To see whether this results in better or poorer performance of the various optical mixers, a series of ASAP ray trace runs were completed. Three different values of x/f were considered and FIG. 14 shows how flux uniformity is affected. Each x/f value has a corresponding "best" L/W value (i.e. length) that maximizes mixer performance. However, superior levels of flux uniformity appear to be achievable with a properly optimized mixer length, regardless of x/f. Thus, we can eliminate x/f as a full optimization variable as we further compare optical mixer designs. For the comparisons that follow, we use x/f=1.01.

Figure 15A:
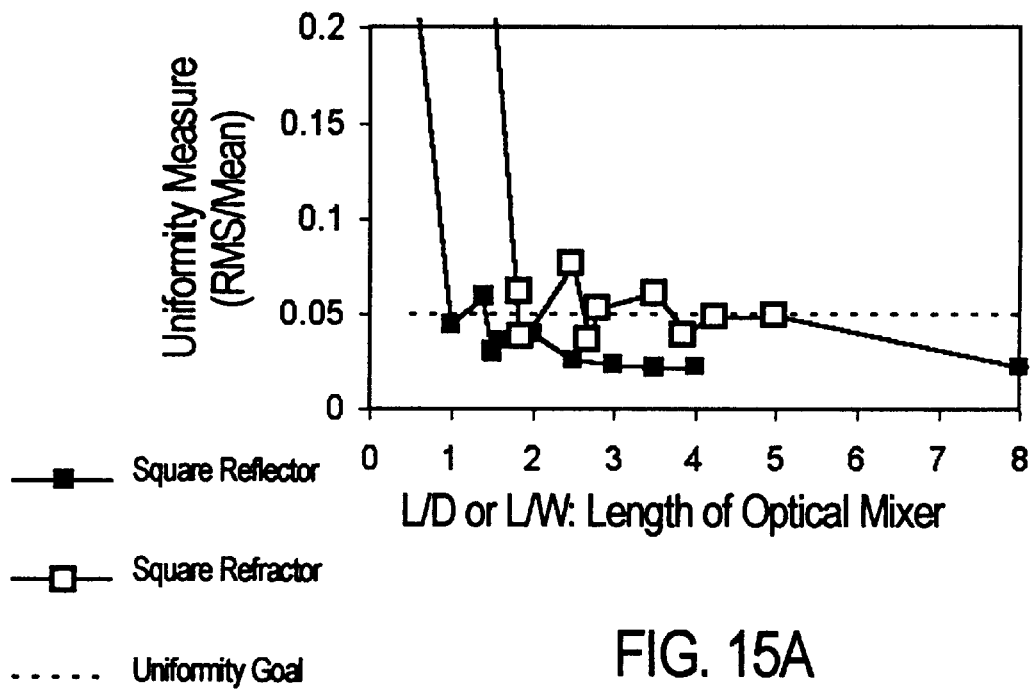
FIG. 15A illustrates a uniformity measure (RMS/mean) versus optical mixer length for square cross section optical mixers and FIG. 15B is for uniformity measure in terms of the minimum/mean.
Figure 15B:
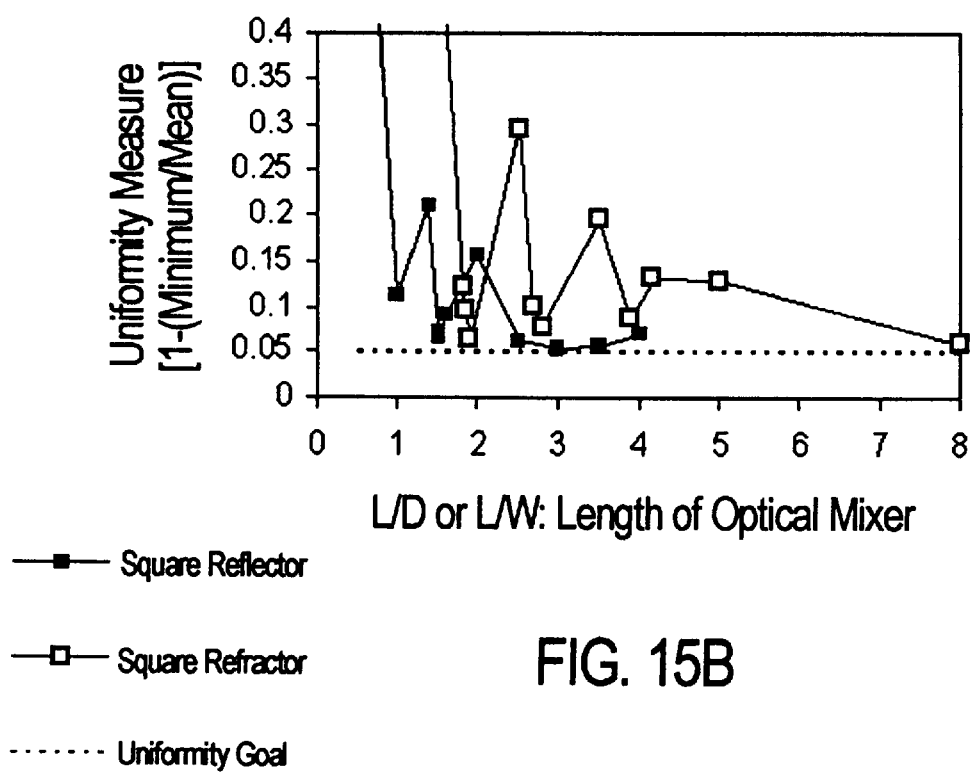

Considering the two square-shaped optical mixers (the square-shaped tube 65 and the square reflector tube 85), FIGS. 15A and 15B show that both designs can achieve a flux uniformity goal of +1–5% when measured in terms of an rms standard deviation. Achieving a minimum flux within 5% of the average flux is a more difficult goal to achieve. Note the periodic fluctuations in flux uniformity as the length of the various optical mixers increase, showing that certain mixers lengths perform better than others.

The reflector tube 85 tends to stabilize, in terms of flux uniformity, at shorter mixer lengths than the refractive tube 65. This is due to the longer path length of the rays 88 in the refractive tube 65, owing to the refraction of the light rays 88 more along the axis of the tube 65 as the rays 88 pass through the air/silica interface. Uniformity data for the reflector tube 85 is shown only out to an L/W of 4, while the refractive tube 65 is plotted out to an L/D of 8. The reflector tube 85 has a short practical limit because of reflectance losses that occur with increased mixer lengths. Longer mixer lengths require additional reflections before the rays 88 reach the exit aperture 90. By the time the rays 88 have reached the aperture 90 of the reflector tube 85 with an L/W of 3, the rays 88 have been reflected about three times, on average. The refractive tube 65 does not see this problem because TIR of the light 80 within the tube 65 essentially eliminates reflectance loss.

Figure 16:
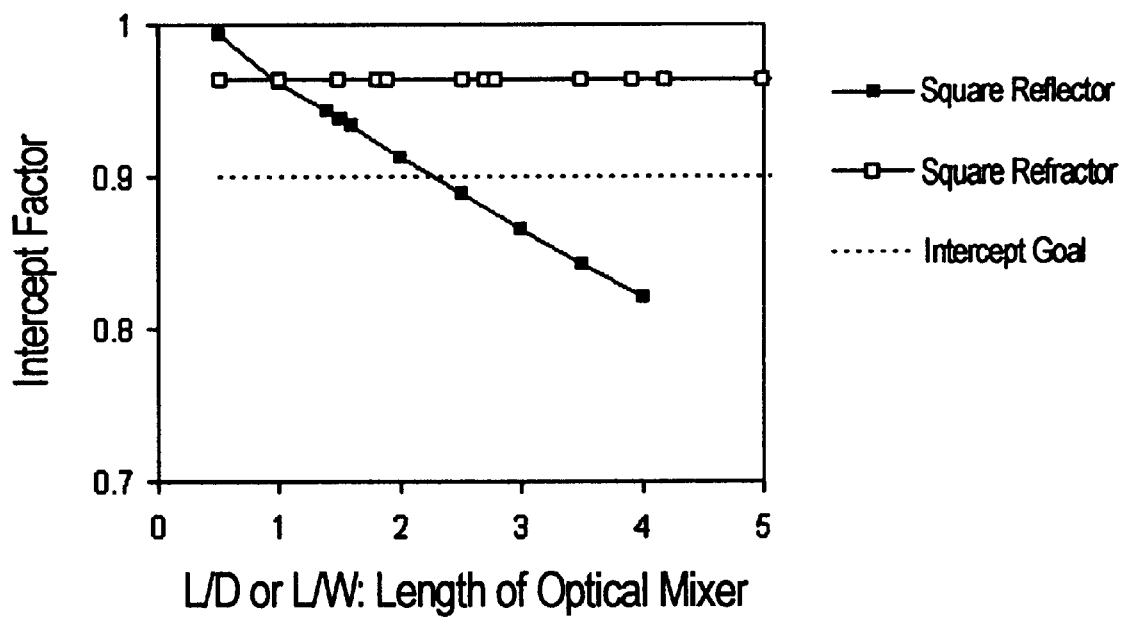
FIG. 16 illustrates intercept factor versus optical mixer length for a reflective mixer and a refractive mixer.

This optical loss is quantified in FIG. 16, and is noted as "Intercept Factor" consistent with NREL terminology in this area. This optical loss of the square refractive mixer is fixed at 3.6%, consistent with the reflectance loss at the air/silica interface. The NREL goal for Intercept Factor is 90%, and is satisfied with the square refractor and for reflective mixers with L/D's below 2.2.

Figure 17:
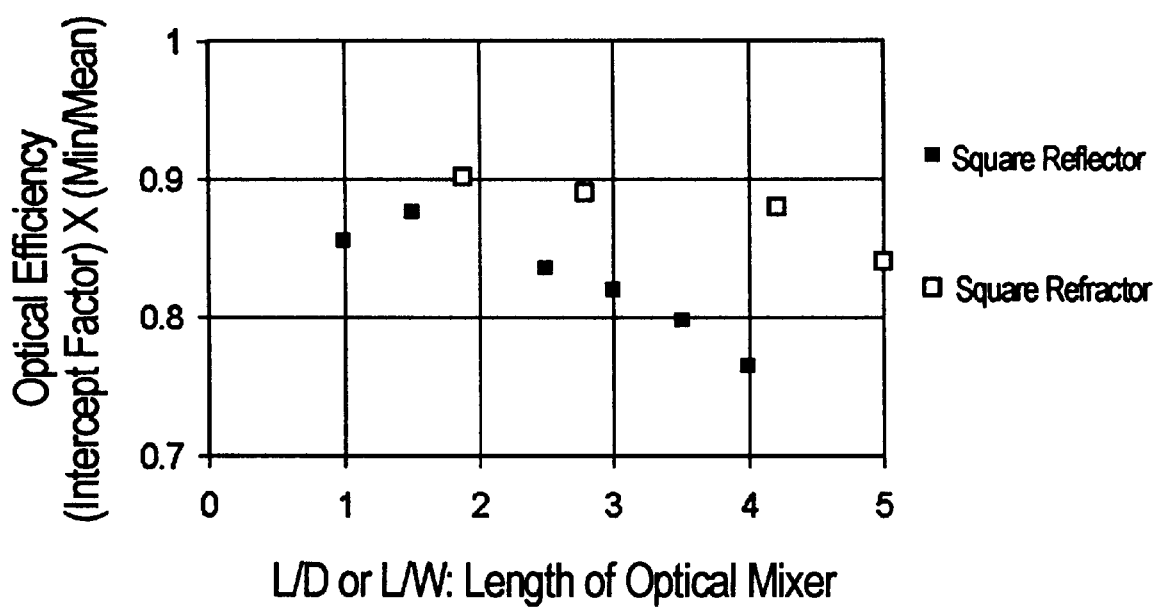
FIG. 17 illustrates an overall comparison of optical mixer designs for reflective and refractive mixers.

To account for the impact of both flux uniformity and intercept factor, the two effects have been incorporated together, as shown in FIG. 17. "Optical Efficiency" is shown as the product of "Intercept Factor" and "(Min/Mean)". The intercept factor accounts for reflection losses, and the second term accounts for the impact that flux non-uniformity has on CPV cell array output. This is based on the assumption that CPV performance output is limited by, and proportional to, the cells 30 in the array with the lowest irradiance. This approach makes it clear that both factors are equally important, and it allows us to compare the mixers more directly.

In FIG. 17, only optical mixers of preferred lengths are shown. Various optical mixers with lengths that result in poorer performance are then not most preferred but are operative embodiments. Selected lengths for the square refractive tube 65 are (in L/W terms): 1.9, 2.8, 4.2, and 5. Selected lengths for the reflector tube 85 are: 1, 1.52, 2.5, 3, 3.5, and 4.

The best refractive tube 65 has an L/W of 1.9, and achieves an overall optical efficiency above 90%. The best reflector tube 85 has an L/W of 1.52, an overall optical efficiency of about 87%. Longer versions of the reflector tube 85 drop in performance due to increased reflectance losses. However, both types of mixers are excellent performers and other considerations, such as cost, must be assessed and included in a complete commercial evaluation.

Another aspect of the invention is minimizing tracking errors which impacts on overall electric output for the cells 30 using the various optical mixers. For low concentration ratios of 200 times, we do not expect that the optical intercept will be significantly affected by small tracking errors. But it is probable that flux uniformity can be more adversely affected, especially since we wish to maintain such high levels of uniformity. To address this issue, a series of ray trace results were made with fixed tracking errors up to 4 mrad. These tracking errors are not rms standard deviations, but are single fixed levels of angular offset.

For the optical mixers having a square shape, two principal direction of tracking errors are possible: errors toward a corner and errors toward a flat face. Both directions of error are shown below, for both the reflector tube 85 and the refractive tube 65. Only a few data points were obtained, but the direction of the tracking error appears to make little or no difference.

Figure 18:
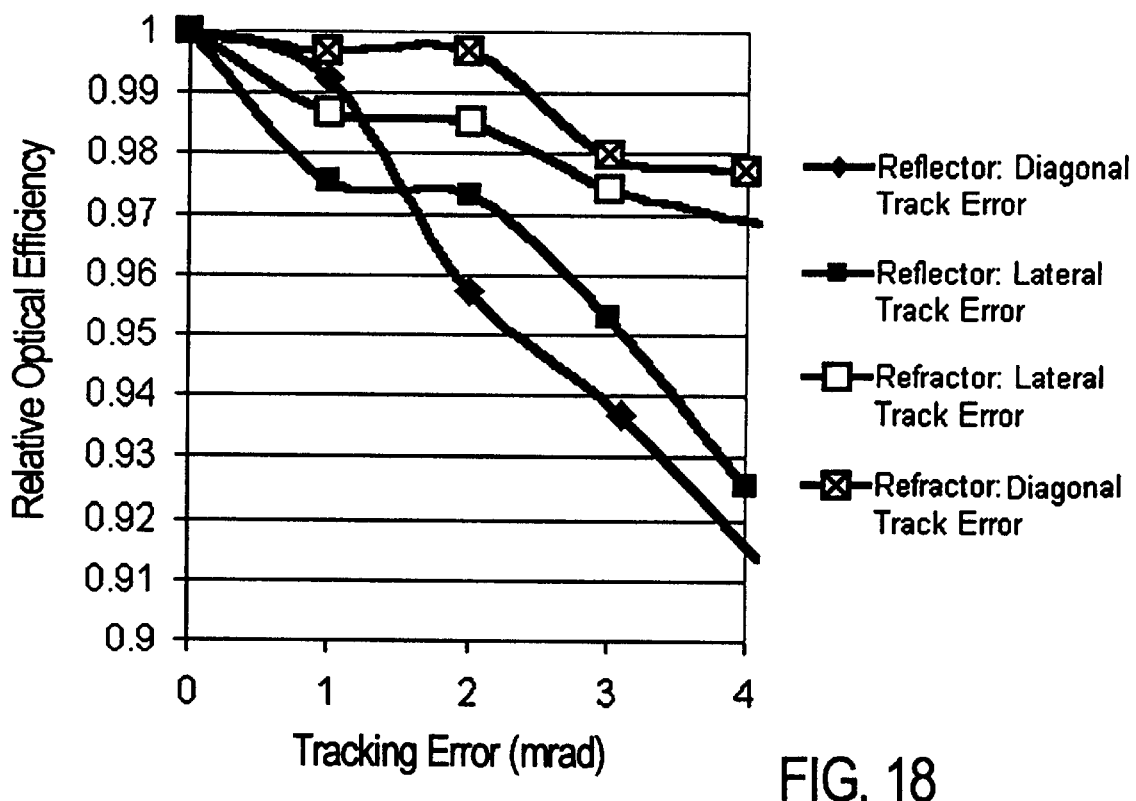
FIG. 18 illustrates sensitivity to tracking errors in terms of optical efficiency for different types of mixers.

Relative optical efficiency is shown in FIG. 18 and includes the drop off in both optical intercept (very small) and flux uniformity (the dominant affect) as quantified by the drop in minimum flux over the array of the CPV cells 30. Overall, the impact of tracking errors is quite small, particularly for the refractive tube 65. For this tube 65, tracking errors up to about 2.5 mrad are predicted to result in less than a 2% drop off in performance.

Figure 19:
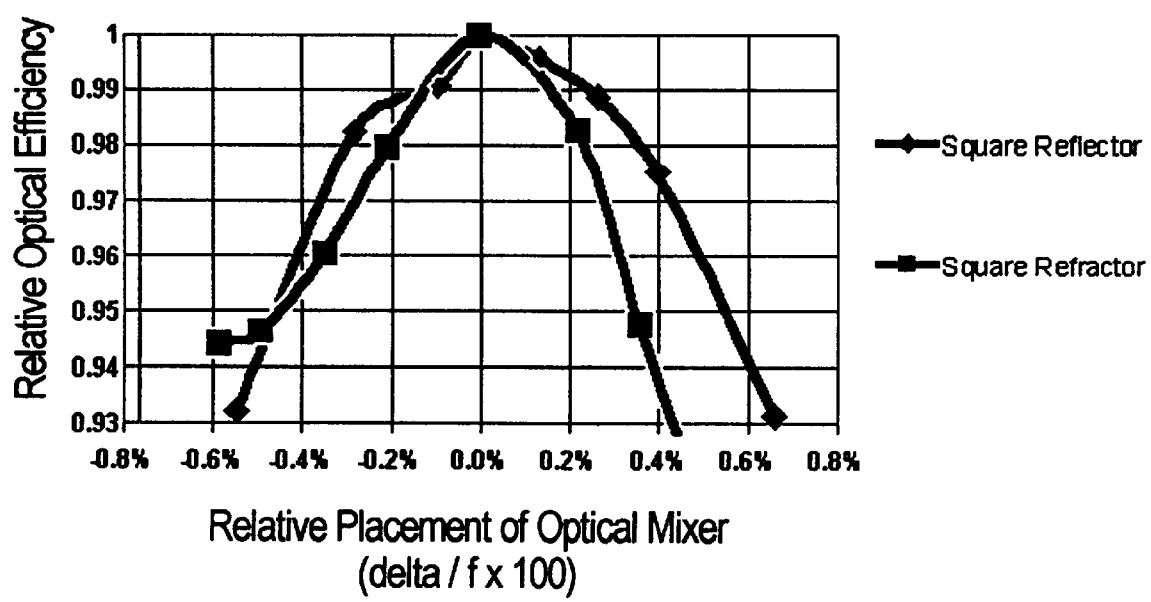
FIG. 19 illustrates sensitivity to placement along a focal axis in terms of optical efficiency for different types of mixers.

Further, the impact that mixer placement accuracy has on performance has been quantified. Obviously the reflected mixer cannot be placed exactly at the proper place with respect to the primary reflector dish 10 focal point 60. And to some degree, the focal length of the dish 10 can change slightly at various pitch angles due to structural sag. In any case, it is important that flux uniformity at the rear aperture of the optical mixer not rely heavily on precise placement accuracy. FIG. 19 shows how overall CPV cell output is expected to fall for various amounts of placement accuracy. The x-axis is labeled as "Relative Placement of Optical Mixer" and is defined as displacement along the focal axis, relative to the optimal placement of the particular mixer (i.e. the location that produces the highest overall optical efficiency). The data indicates that the square reflector tube 80 has slightly less sensitivity to placement accuracy than the refractive tube 65. Placement errors of less than +/−0.2% are predicted to result in a performance drop off of less than 2%. As an example, a 0.2% placement error for a 10-meter dish with an f/D of 0.6 translates into a distance of about 4 mm (about 3 3/16"). As with tracking errors, the drop off is almost entirely due to disturbance of the flux profile (e.g., a single cell in the array experiencing a reduced irradiance level).

In another preferred form of the invention, higher light concentration ratios are achieved with concentration ratios as high as 2000. This is most preferably done by concentration within the optical mixer as opposed to the dish 10. In a preferred form for an optical mixer 110, a refractive form is used.

Figure 21:
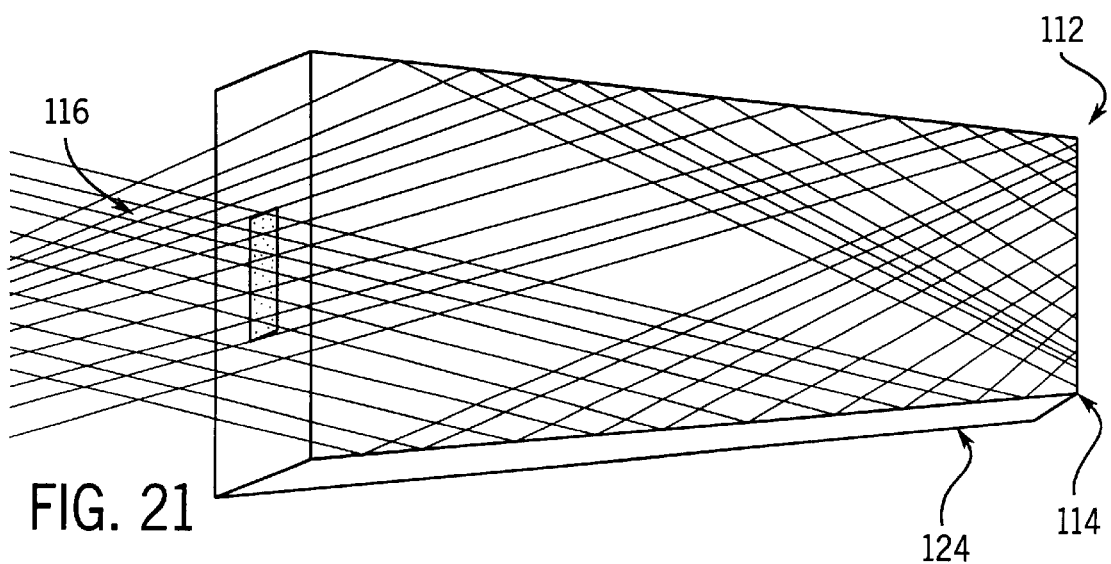
FIG. 21 illustrates a square cross sectioned, truncated pyramidal optical mixer.

In one form of the preferred embodiment, a square truncated pyramidal mixer 112 (see FIG. 21) has the advantage of simplicity and is easy to manufacture. This design has a geometric advantage, since exit aperture 114 of the optical mixer 112 is square in shape—which is also the typical shape of an array of CPV cells 115 that would be placed at this exit aperture 114. Formulated for a total concentration ratio of about 2000 times, this example achieves an optical intercept of almost 95%, and also achieves very high flux uniformity across the entire array (within about +/−5% of the average flux).

Figure 22:
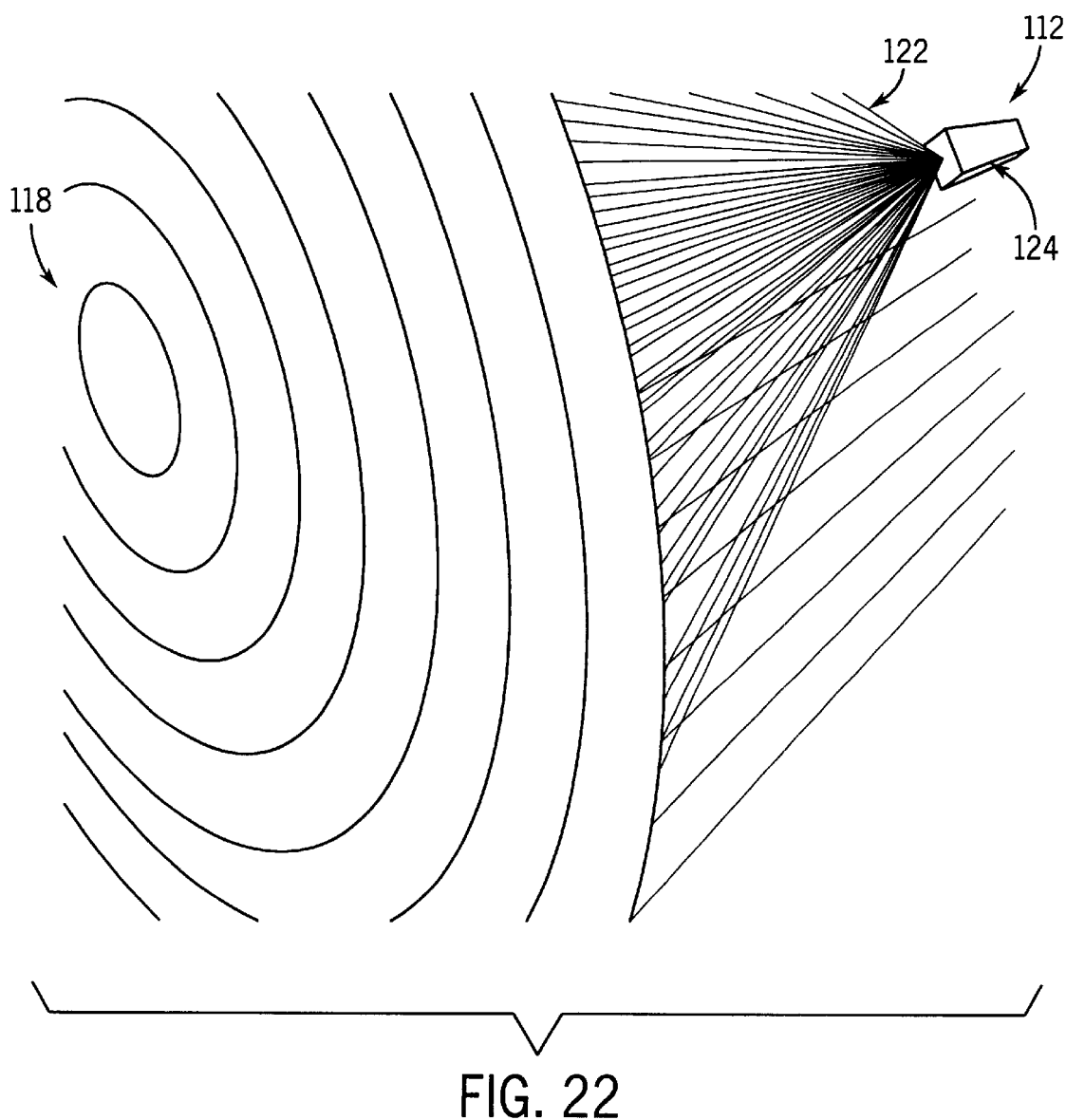
FIG. 22 illustrates a concentrator dish and the pyramidal optical mixer of FIG. 21.

In the embodiment, the truncated pyramidal refractive optical mixer 112 can, for example, be a solid, shaped tube of fused silica that is placed just about focal point 116 of dish 118 (see FIG. 22). Entrance aperture 120 and the exit aperture 114 are both substantially square in cross section shape, and the sides of the optical mixer 112 are sloped to connect the exit aperture 114 with the entrance aperture 120. The square entrance aperture 120 of the silica face closest to the dish 118 is the target plane for the dish 118. Rays 122 of sunlight are refracted as they pass into the silica, and only a small amount of energy is reflected and lost. Nearly all the rest of the light rays 122 that enter the optical mixer 112 will reach the exit aperture 114 with virtually no optical loss. The optical loss is very small because as the light rays 122 pass through the optical mixer 112 and encounter walls 124 the rays 122 are entirely reflected due to TIR. At the exit aperture 114 of the optical mixer 112 the light rays 122 have been well mixed and highly uniform irradiance is achieved. The slope of the sides are preferably not too severe, since optical losses would occur if the conditions for TIR are not satisfied. In evaluating this design, the optical characteristics of a typical dish type concentrator were assumed (i.e. f/D=0.6, slope errors of 3 mrad rms specularity of 1 mrad rms). Detailed optical performance was determined by constructing a geometric and optical model of the design, using the ray trace code ASAP described hereinbefore and substantially the same set of optical constants and optical error assumptions. The model was then used to analyze the optical system. The refractive index of the silica was taken as 1.45, and a pillbox sunshape with a half-angle width of 0.267 degrees was used. For the purpose of simplicity, the reflectance of the primary dish 118 was assumed to be 100%, although specularity and slope errors were included in the model, as noted above. Reflectance losses off the front surface of the silica optical mixer 112 (about 3.7%) were calculated within ASAP based on Fresnel losses. The model also accounted for refraction and TIR. Absorption of light by the silica optical mixer 112 was ignored, since we expect this loss to be negligible. The CPV cells 114 were not modeled. Rather, to evaluate flux uniformity, we examined only the exit aperture 114 of the silica optical mixer 112 and a 15×15 bin array was used to accumulate ray trace "hits". The ray trace analysis was performed for a fixed wavelength of 600 nm, and in general, 600,000 rays were traced for each run.

Figure 24:
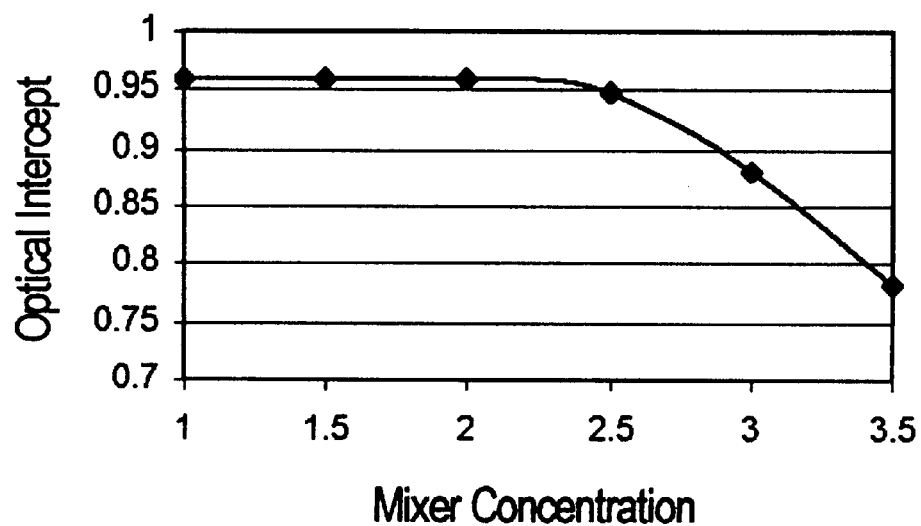
FIG. 24 illustrates mixer concentration versus optical intercept for the optical mixer of FIG. 21.
Figure 23:
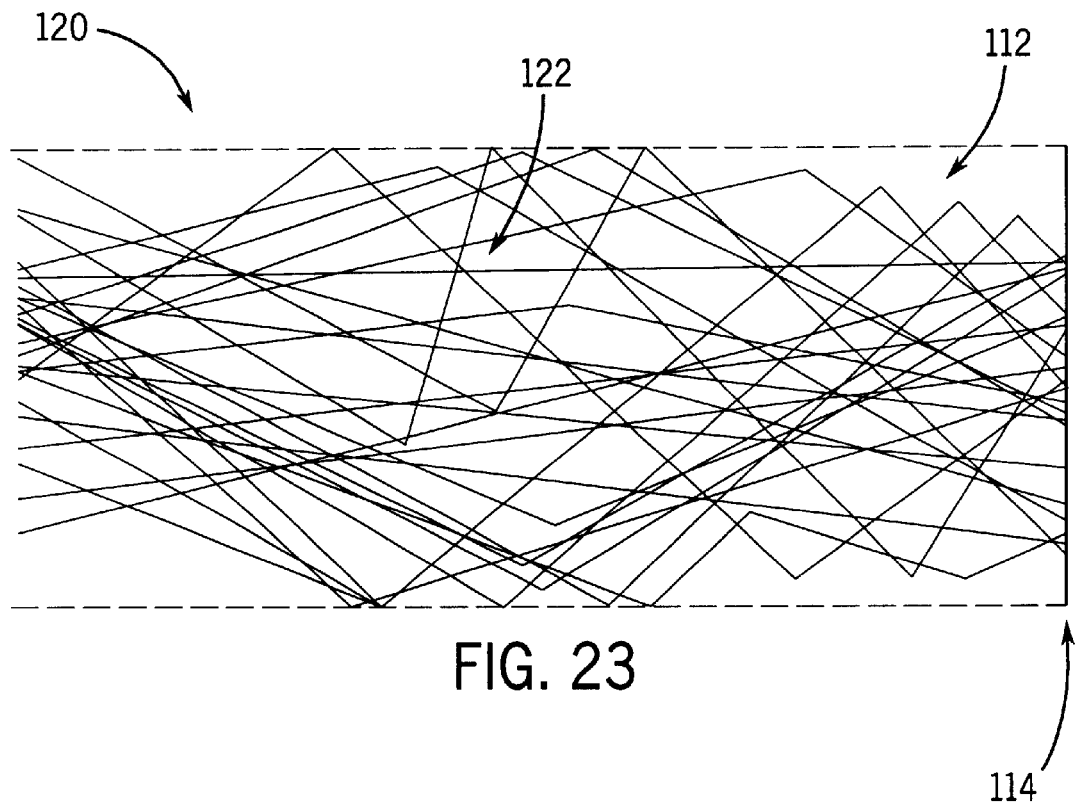
FIG. 23 illustrates a ray trace graphic of the optical mixer of FIG. 21.
Figure 25:
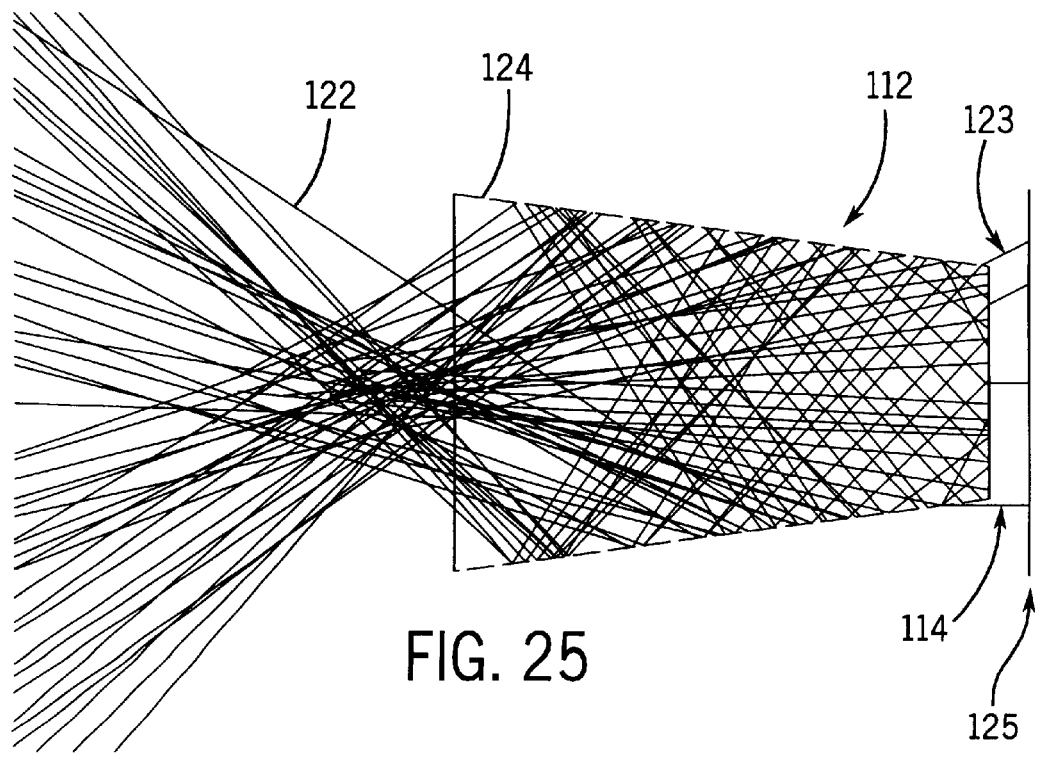
FIG. 25 illustrates a ray trace for the optical mixer of FIG. 21 along with leaked light rays.

Shown in FIG. 23 is a close-up of an ASAP graphic of the pyramidal refractive optical mixer 112 used to achieve an overall concentration ratio of about 2000 times ambient. The concentration ratio of the parabolic dish 118 is about 800, a concentration that is well within the optical capabilities of a dish with a 3 mrad rms slope error. The pyramidal optical mixer 112 provides further concentration as the light rays 122 are channeled to the rear of the optical mixer 112. A mixer concentration of 2.5 has been selected for this design. As shown in FIG. 24, this is the practical limit of concentration for the design. Higher optical concentration within the optical mixer 112 can result in large optical losses, largely because the conditions for TIR are not satisfied so light rays 123 begins to "leak" through the sides of the silica optical mixer 112. The side view of the optical mixer 112 in FIG. 25 better illustrates this "leakage" effect (a few "leaked" rays are visible near the rear of the optical mixer 112). The line 124 (parallel to the edge of the exit aperture 114) just past the end of the optical mixer 112 is a "light shield" that has been included in the ASAP model to separate incoming source light from concentrated light. Many of the "leaked" rays 123 intercept the light shield (the line 124) as depicted in this figure. For the design shown here, with a mixer concentration of 2.5, the number of leaked rays 123 is very small (less than 1%).

For the 2000:1 overall concentration ratio, the length of the pyramidal optical mixer 112 is optimized when the length is about 1.76 times the width of the entrance aperture 120. The optical intercept, which is defined as the ratio of light reflected from the primary dish 118 that intercepts the exit aperture 114 of the optical mixer 112, for this design is found to be 95%. Most of the loss is reflection loss off the front surface of the entrance aperture 120 of the silica optical mixer 112 (about 3.7%), with most of the rest of the loss due to "leakage" from the optical mixer 112, and a very small amount due to optical intercept loss (i.e. light reflected from the primary that "misses" the entrance aperture 120 of the optical mixer 112).

Figure 26A:
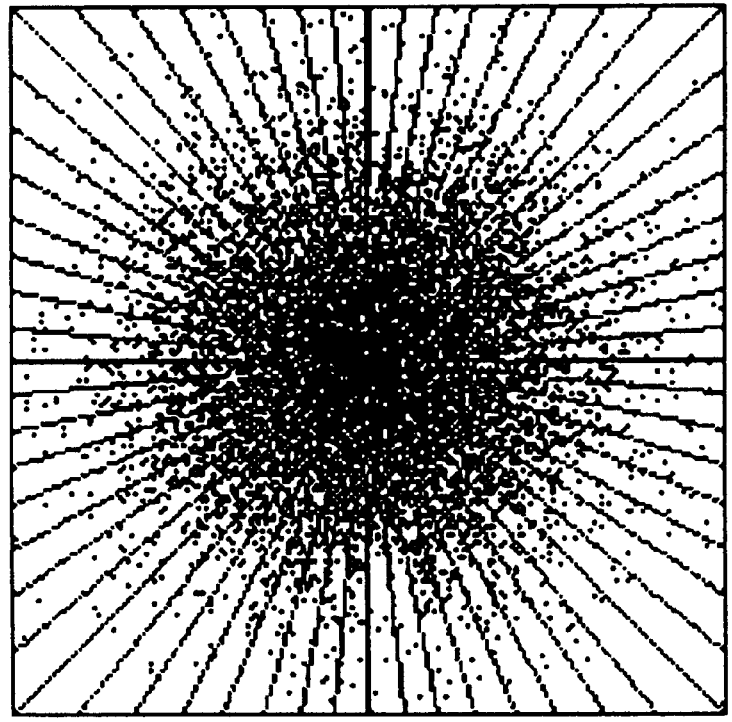
FIG. 26A illustrates a ray trace light flux cross section at the entrance aperture of the optical mixer of FIG. 21
Figure 26B:
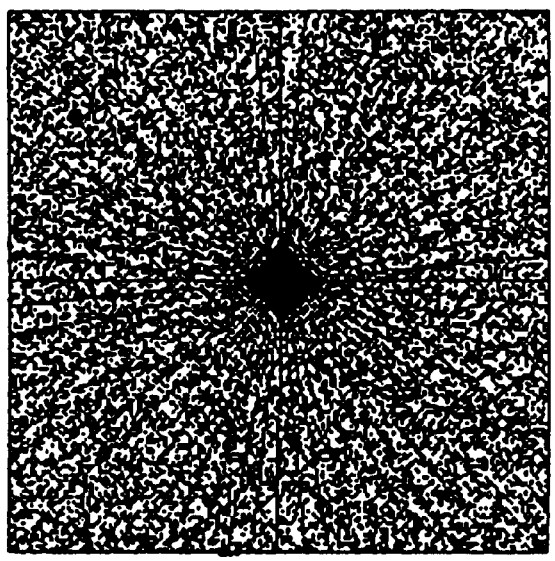
FIG. 26B shows the ray trace light flux cross section at the exit aperture of the optical mixer.

To illustrate the high level of flux uniformity that this design achieves, two ASAP "spot profiles" are shown in FIGS. 26A and 26B where each dot represents a traced ray. FIG. 26A shows the highly non-uniform flux entering the optical mixer 112. FIG. 26A shows the flux at the exit aperture 114 of the optical mixer 112, where the CPV cells 115 are located. FIGS. 26A and 26B are shown in approximately their relative sizes; with the area of the exit aperture 114 about 2.5 times less than the entrance aperture 120. The flux at the exit aperture 114 is highly uniform and the minimum flux irradiance is within 5% of the average flux across the entire array of the cells 115. Only a few areas fall outside of the range of +/−2.5% of the average. The standard deviation of the flux, relative to the mean flux, over the exit aperture 114 is only 2%.

Figure 27:
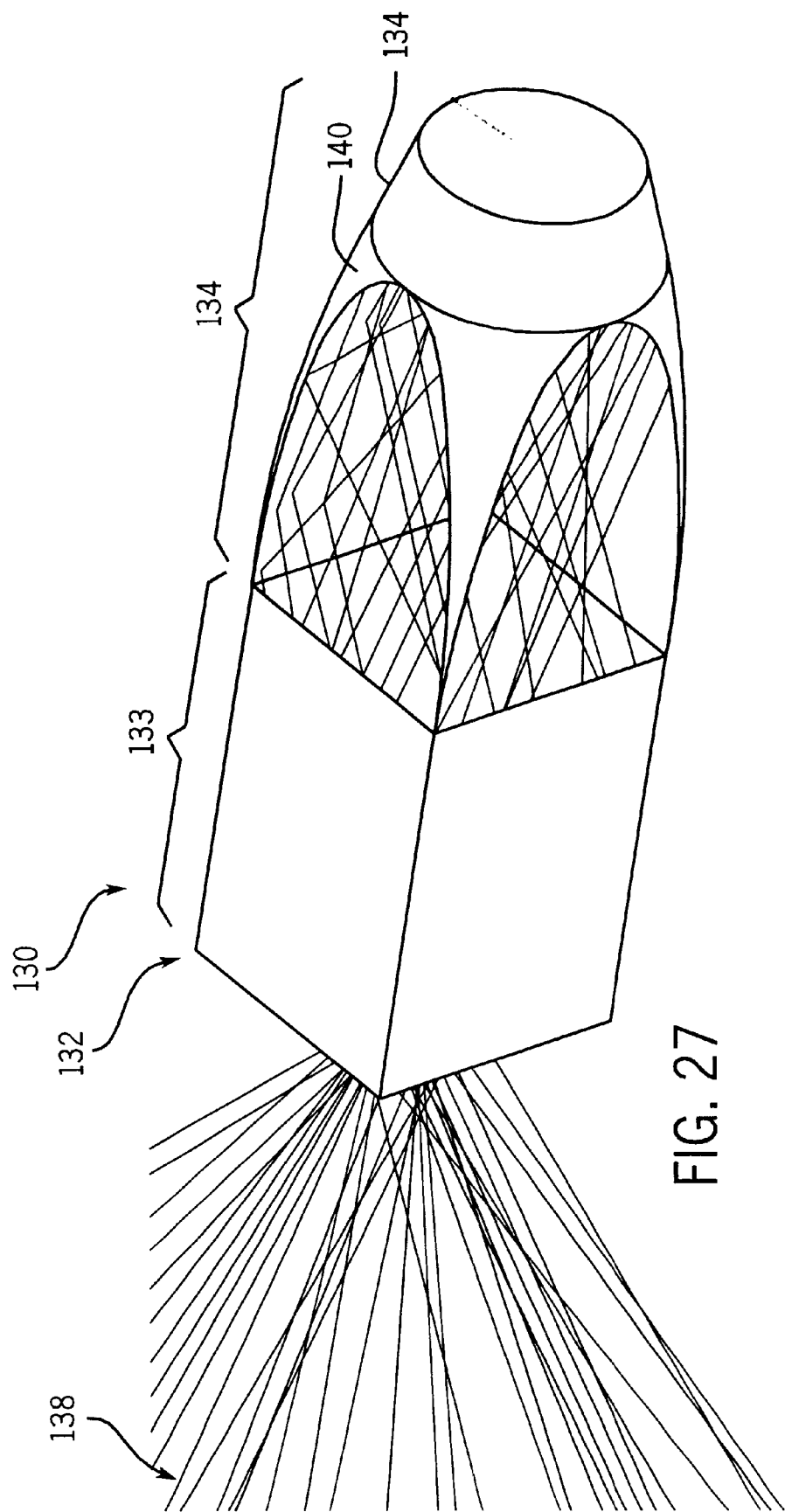
FIG. 27 illustrates a two-stage optical mixer with a single CPC concentrator.

In another embodiment of the invention shown in FIG. 27 a two-stage optical mixer 130 has an entrance aperture 132 for first portion 133 for the refractive element. The second portion of the optical mixer 130 is a CPC 134 positioned just beyond the square mixing portion 136. The entire two-stage optical mixer 130 is solid, modeled as silica. The basic concept is that the square-shaped first portion 133 acts to even out the flux, while the second portion (the CPC 134), serves to further concentrate light 138. This two-stage single-CPC refractive optical mixer 130 was analyzed through ray tracing using the same model assumptions described hereinbefore.

In one form of the invention the optical mixer 130 is a square-shaped refractive mixer, although other broken symmetry cross sections (not cylindrical) can be used. In general, this can mean a plurality of substantially flat surfaces connected at discontinuities, or even curved surfaces, including conventional shapes such as polynomial based surface shapes, compound curve shapes (e.g., parabolic, elliptical, hyperbolic) and also conventional tailored nonimaging shapes used in solar energy and other nonimaging optical technologies. In the care of tailored or curved surfaces, the symmetry can be broken (non-uniform longitudinal cross sections, e.g.) or can be a specific tailored curved surface which causes TIR and efficient concentration at the exit aperture 114 (this also applies to the optical mixers, both reflective and refractive as described hereinbefore).

Note further that the CPC 134 in FIG. 27 has truncated sides 140 (partially shown) so that it fits geometrically with the first portion 133 which has a square cross section and produces flux uniformity. Adjacent the exit aperture 114 of the CPC 134 are the CPV cells 115, where the concentrated light terminates. The CPC profile has been designed to assure that all the rays within the designated acceptance angle (30 degrees used here, after refraction) will intercept the circular bottom of the CPC. The concentration ratio of the untruncated CPC is 3.33. Truncation of the sides of the CPC (to achieve a square cross section) decreases the concentration down to about 2.12.

Figure 28:
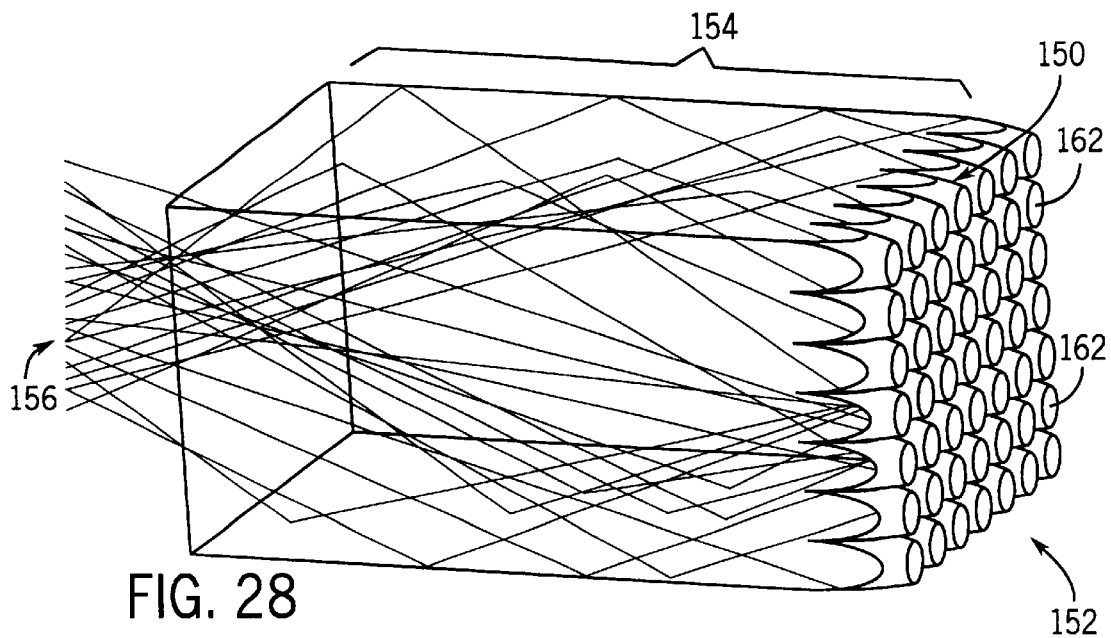
FIG. 28 illustrates a two-stage optical mixer with a plurality of CPC concentrators.

In yet another embodiment, multiple ones of CPCs 150 are used for an optical mixer 152 (see, for example, FIG. 28), rather than just the single CPC 134. A two-stage design is still used, a square-shaped optical mixer first portion 154 followed by an array of the CPCs 150 that provide further concentration of the incoming light 156. The number of the CPCs 150 used is equal to the number of the cells 115 used in the CPV array. In this way, the light 156 funneled by each of the CPCs 150 is directed to an individual one of the CPV cells 115. As long as the light 156 funneled by each of the CPCs 150 is equal, each of the cells 115 will see the same amount of the light 156 and overall cell array performance will be maintained. This is consistent with the design requirement for uniform distribution of the light 156 between the individual cells 115, not requiring uniform irradiance across each of the individual cells 115.

Figure 29:
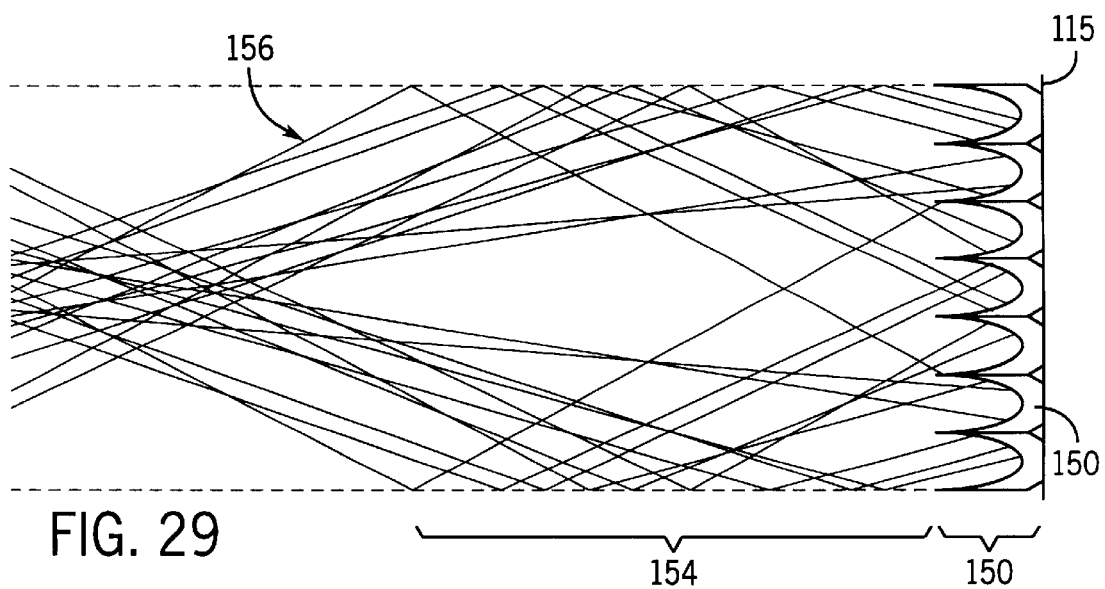
FIG. 29 illustrates a longitudinal light ray trace for the two stage optical mixer of FIG. 28.

With a properly designed square-shaped first-portion 154 (or other shapes as described hereinbefore), we can ensure that the flux of light 156 entering each of the CPCs 150 is nearly equal. FIG. 29 shows the basic design of this example two-stage multiple-CPC refractive mixer 152. The overall concentration ratio is 2000 which allows for direct comparison with the pyramidal optical mixer 112. We show a 7×7 array of the CPCs 150, which is about the right amount for a 10-m2 exit aperture 162 and assuming a cell size of about 1 cm across. Note that a bundle of, or plurality of, the first portion 150 can also be used with an attached one of the CPCs 150 for each of the ones of the bundle.

The use of multiple ones of the CPCs 150 advantageously reduces the overall mass of the optical mixer 152, compared to the single-CPC design described earlier. Note also that the exit aperture 162 of each of the CPCs 150 is spaced apart from its neighbors; so individual ones of the cells 115 are therefore also spaced apart. This can offer advantages in terms of heat removal from the cells 115, or cell array interconnection, since it provides for space between each of the cells 115. Round-shaped cells 115 can also be a good match for like shaped ones of the CPCs 150, and allow effective use of this optical mixer design.

We have used the same basic profile of the CPC 134 described hereinbefore except that the CPCs 150 are scaled down in size to fit as an array. The CPCs 150 were also preferably truncated to a square cross section so they would fit as a packed array. Truncation in this manner does reduce the level of concentration that is achieved from 3.33 to 2.12. Hexagonal truncation would achieve a much smaller sacrifice in concentration. However, an array of hexagonally-truncated form of the CPCs 150 would not fully cover the square exit aperture 162 of the mixer's first-portion 154, resulting in a significant optical penalty for a 7×7 array. For a much larger array (e.g. 30×30), the penalty associated with hexagonal truncation would be much smaller, so it is possible it might be preferable to sacrificing the loss in concentration. For the purpose of establishing a benchmark based on performance however, we have assumed CPC truncation to achieve the square cross section. These arrays can be close packed, to minimize loss, or partially close packed as a compromise between loss and area coverage.

The optimal L/W for the square first-stage portion of the optical mixer 130 or 152 was found to be about 1.70. The CPCs 150 add only a small additional length, bringing the total length to about 1.971 times the mixer width. FIG. 29 is a side view of the optical mixer 130, clearly displaying traced rays 172.

Figure 30A:
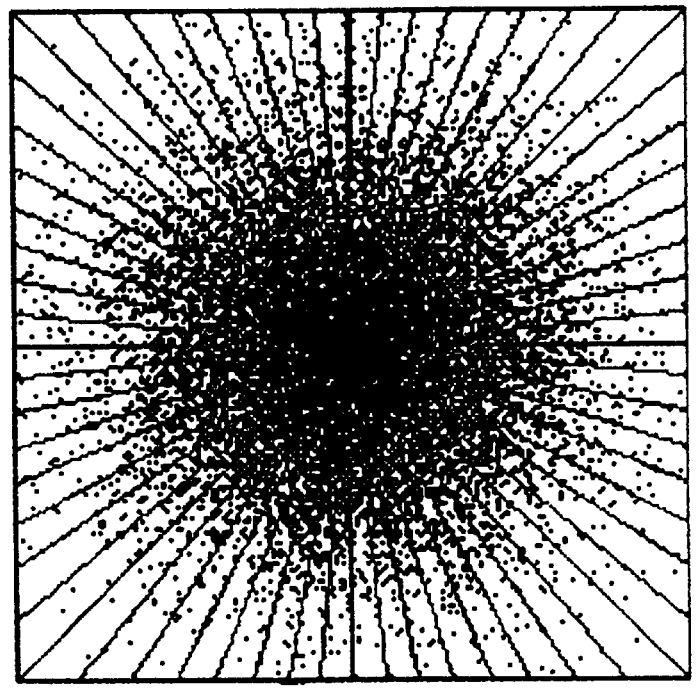
FIG. 30A illustrates a ray trace light flux cross section at the entrance aperture of this optical mixer of FIG. 28
Figure 30B:
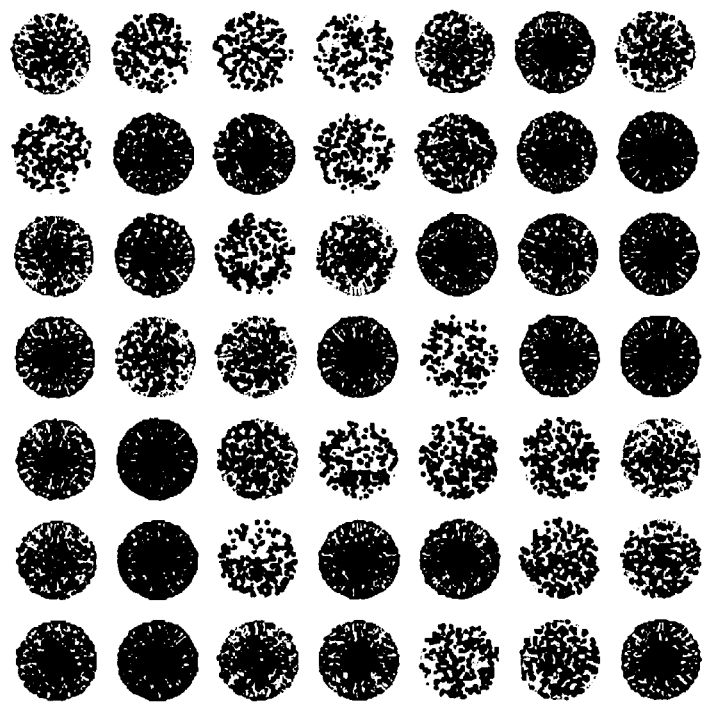
FIG. 30B illustrates the ray trace at the exit face of the plurality of the CPCs of FIG. 28.

ASAP "spots diagrams" are shown next in FIGS. 30A and 30B, for the incoming traced rays (FIG. 30A) and on the rear circular termination planes of the CPCs 150 (FIG. 30B).

This design achieves an optical intercept of 95%, that is, 95% of the light reflected from the primary mirror is incident upon the rear of the CPCs 150. The distribution of the flux between the CPCs 150/cells 115 is also highly equal. The cell 115 with the minimum flux irradiance is within 3% of the average flux across the entire cell array. The standard deviation of the flux, relative to the mean flux, computed over all forty-nine of the exit CPC apertures 162 is less than 2%. Both of these measures are slightly superior to the best values achieved for any of the optical mixers that have been evaluated.

Figure 31:
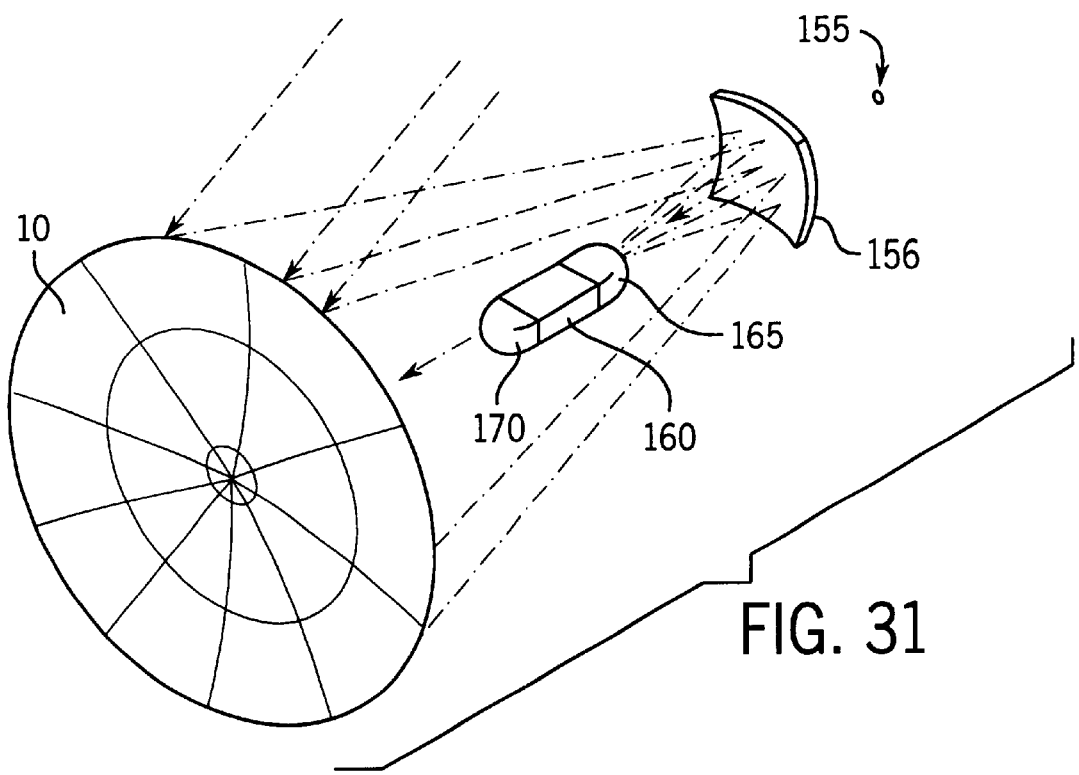
FIG. 31 illustrates a cassegrainian form of another optical mixer embodiment.

In yet another embodiment, a secondary hyperbolic reflector 150, or any type of "beam down" reflector, can be placed between the dish 10 and the focal point 20 (see FIG. 31). In a preferred form the beam down reflector can reflect only a portion of the solar spectrum wavelengths. For example, infrared can be rejected, which is beyond the solar cell band gap, thereby reducing thermal loading of the solar cells. One can also choose to reject the ultraviolet part of the solar spectrum to reduce solarizing of the solar cell encapsulation material with minimal loss of efficiency (only a small portion of UV radiation is converted to useful electrical energy). In this configuration the secondary hyperbolic reflector 150 is placed between a primary focal zone 155 and the dish 10. An optical mixer 160 is located between the focal zone 155 and the dish 10 or even behind the dish 10. Since the f/d ratio for this configuration is increased beyond the value 0.6 when using the dish 10 alone, one can provide further concentration via an angle transforming CPC 165. In addition another CPC 170 or plurality thereof can be disposed after the optical mixer 160. Alternatively, the optical mixer 160 can comprise a conventional tailored nomimaging optical element (reflecting or refracting) to carry our these functions.

Figure 32:
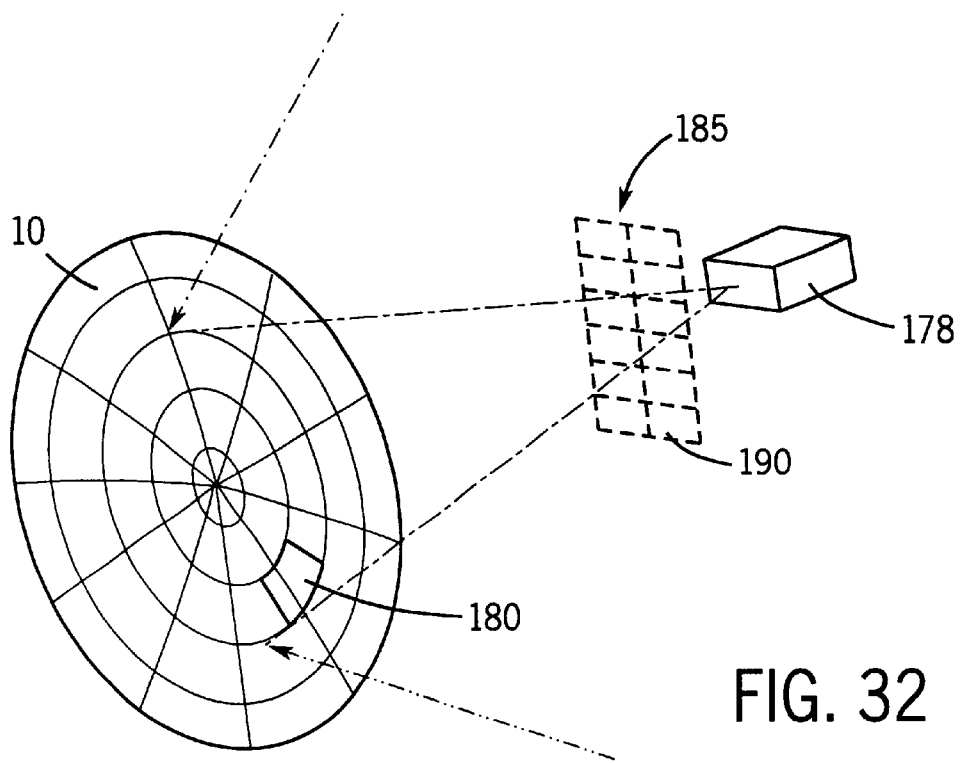
FIG. 32 illustrates a reflector dish having structured focal portions for optimizing optical mixing.

Modifications to the primary concentrating element can also be used in ameliorating nonuniform arradiance. We illustrate this by a system that will be referred to as a statistical mixer. This system uses a special form of the primary reflector dish 10 alone to achieve flux uniformity for optical mixer 178. The primary reflector dish 10 is subdivided into cells Pi 180 and a focal plane 185 (shown in phantom) is divided into cells Fi 190 (see FIG. 32). The areas of the cells Pi 180 and the cells Fi 190 need not be equal. For example, we might weight the cells Pi 180 by 1/cos $\phi$ so that each delivers the same power to the focal plane 185, or we can choose some other weighting. A random mapping of the cells Pi 180→Fj can be performed using a random number generator. Then each of the cells Pi 180 images to the assigned cell Fj 190. The resulting flux on the focal plane 185 is therefore smoothed out. One can perform a number of such numerical experiments, each time using a different random number seed to generate a different map and then select the one that gives the most uniform irradiance. A tradeoff to consider is flux uniformity vs. spill-over, and thus one tries to maximize both flux uniformity and throughput.

While preferred embodiments of the inventions have been shown and described, it will be clear to those skilled in the art that various changes and modifications can be made without departing from the invention in its broader aspects as set forth in the claims provided hereinafter.

what is claimed is:

1. A nonimaging light concentrator system, comprising:
a primary collector of light having a focal zone;
an optical mixer disposed near the focal zone for collecting light from the primary collector, the optical mixer having a broken symmetry shape and further including a transparent entrance aperture, a reflective housing having reflective surface components with the broken symmetry shape and a transparent exit aperture, and the reflective housing with broken symmetry shape providing reflection of the light input to the optical mixer; and
an array of photovoltaic cells disposed near the transparent exit aperture.

2. The nonimaging light concentrator as defined in claim 1 wherein the broken symmetry shape comprises a plurality of reflective walls coupled at discontinuities in slope.

3. The nonirnaging light concentrator system as defined in claim 1 wherein the primary collector of light is selected from the group consisting of a reflector dish and a lens.

4. The nonimaging light concentrator system as defined in claim 3 wherein the dish is constructed to provide a light concentration of about 100 to 1000 times ambient solar intensity.

5. The nonimaging light concentrator system as defined in claim 1 wherein the optical mixer comprises a solid material.

6. The nonimaging light concentrator system as defined in claim 4 wherein the solid material comprises silica.

7. The nonimaging light concentrator system as defined in claim 1 wherein the optical mixer comprises a hollow container.

8. The nonimaging light concentrator as defined in claim 2 wherein the broken symmetry comprises a structure having a transverse cross section selected from the group consisting of a polygon and arc shaped surfaces.

9. The nonimaging light concentrator as defined in claim 1 wherein the reflective housing comprises a tailored optical design.

10. The nonimaging light concentrator system as defined in claim 1 wherein the optical mixer comprises a container enclosing a liquid of index of refraction $n_1$.

11. The nonimaging light concentrator system as defined in claim 10 wherein the container includes an opaque outer wall and a liner having an index of refraction $n_2$ wherein $(n_1^2 - n_2^2)^{1/2} > \sin \phi$ and $\phi$ is the maximum angle of light incidence with a longitudinal axis of the optical mixer.

12. The nonimaging light concentrator as defined in claim 11 wherein the liner comprises tetrafluoroethylene or fluorocarbon plastic.

13. The nonimaging light concentrator system as defined in claim 1 wherein the optical mixer reflective housing comprises at least one of a surface causing total internal reflection and specular reflection.

14. The nonimaging light concentrator system as defined in claim 13 wherein the reflective housing is selected from the group consisting of a metallic mirror and a multilayer reflective mirror.

15. An optical light concentrator assembly, comprising:

a primary light concentrator having a focal zone;

an optical mixer for collecting concentrated light, the optical mixer having a transparent entrance aperture, a reflective internal housing, a transparent exit aperture and at least one compound curved surface concentrator disposed adjacent to the exit aperture, the reflective internal housing surface providing total internal reflection of the light input to the optical mixer; and an array of photovoltaic cells dispersed near the transparent exit aperture; wherein the optical mixer comprises a shape having broken reflective symmetry.

16. An optical light concentrator, comprising:

a primary collector of light having a focal zone and further comprising a surface which deviates from a parabolic shape in order to achieve uniformity of light irradiance in the focal zone; an optical mixer disposed near the focal zone for collecting light form the primary collector, the optical mixer having a transparent entrance portion, a reflective internal portion and a transparent exit aperture; and an array of photovoltaic cells disposed near the transparent exit aperture.

17. An optical light concentrator assembly, comprising:

a primary light concentrator have a focal zone;

a beam down reflector disposed between the primary light concentrator and the focal zone; and an optical mixer for collecting concentrated light, the optical mixer having a transparent entrance aperture, a reflective internal portion, a transparent exit aperture, the reflective portion providing total internal reflection of the light input to the optical mixer.

18. The optical light concentrator as defined in claim 17 wherein the primary light concentrator comprises at least one of a reflector dish and a refractive lens.

19. The optical light concentrator as defined in claim 17 wherein the beam down reflector is constructed to reflect selected portions of a solar spectrum.

20. The optical light concentrator as defined in claim 17 wherein the beam down reflector comprises a hyperbolic reflector.

21. The optical light concentrator as defined in claim 17 further including an angle transforming concentrator disposed near an entrance to the optical mixer.

* * * * *